(12) United States Patent
Surthi et al.

(10) Patent No.: US 11,729,982 B2
(45) Date of Patent: Aug. 15, 2023

(54) INTEGRATED ASSEMBLIES AND METHODS OF FORMING INTEGRATED ASSEMBLIES

(71) Applicant: Micron Technology, Inc., Boise, ID (US)

(72) Inventors: Shyam Surthi, Boise, ID (US); Richard J. Hill, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 98 days.

(21) Appl. No.: 17/507,660

(22) Filed: Oct. 21, 2021

(65) Prior Publication Data

US 2022/0045072 A1 Feb. 10, 2022

Related U.S. Application Data

(62) Division of application No. 16/863,120, filed on Apr. 30, 2020, now Pat. No. 11,189,629.

(51) Int. Cl.
| | |
|---|---|
| *H01L 27/11582* | (2017.01) |
| *H10B 43/35* | (2023.01) |
| *H10B 41/10* | (2023.01) |
| *H10B 41/27* | (2023.01) |
| *H10B 41/35* | (2023.01) |
| *H10B 43/10* | (2023.01) |
| *H10B 43/27* | (2023.01) |

(52) U.S. Cl.
CPC .............. *H10B 43/35* (2023.02); *H10B 41/10* (2023.02); *H10B 41/27* (2023.02); *H10B 41/35* (2023.02); *H10B 43/10* (2023.02); *H10B 43/27* (2023.02)

(58) Field of Classification Search
CPC ................................ H10B 43/27; H10B 43/20
See application file for complete search history.

(56) References Cited

U.S. PATENT DOCUMENTS

| | | | | |
|---|---|---|---|---|
| 2016/0086972 | A1* | 3/2016 | Zhang | H10B 43/35 438/269 |
| 2019/0198510 | A1* | 6/2019 | Kim | H10B 43/10 |
| 2021/0091106 | A1* | 3/2021 | Wang | H01L 29/40117 |

\* cited by examiner

*Primary Examiner* — Christopher A Johnson
(74) *Attorney, Agent, or Firm* — Wells St. John P.S.

(57) ABSTRACT

Some embodiments include an integrated assembly having a vertical stack of alternating insulative levels and conductive levels. The conductive levels include conductive structures. Channel material extends vertically through the stack. The conductive structures have proximal regions near the channel material, and have distal regions further from the channel material than the proximal regions. The insulative levels have first regions vertically between the proximal regions of neighboring conductive structures, and have second regions vertically between the distal regions of the neighboring conductive structures. Voids are within the insulative levels and extend across portions of the first and second regions. Some embodiments include methods for forming integrated assemblies.

16 Claims, 22 Drawing Sheets

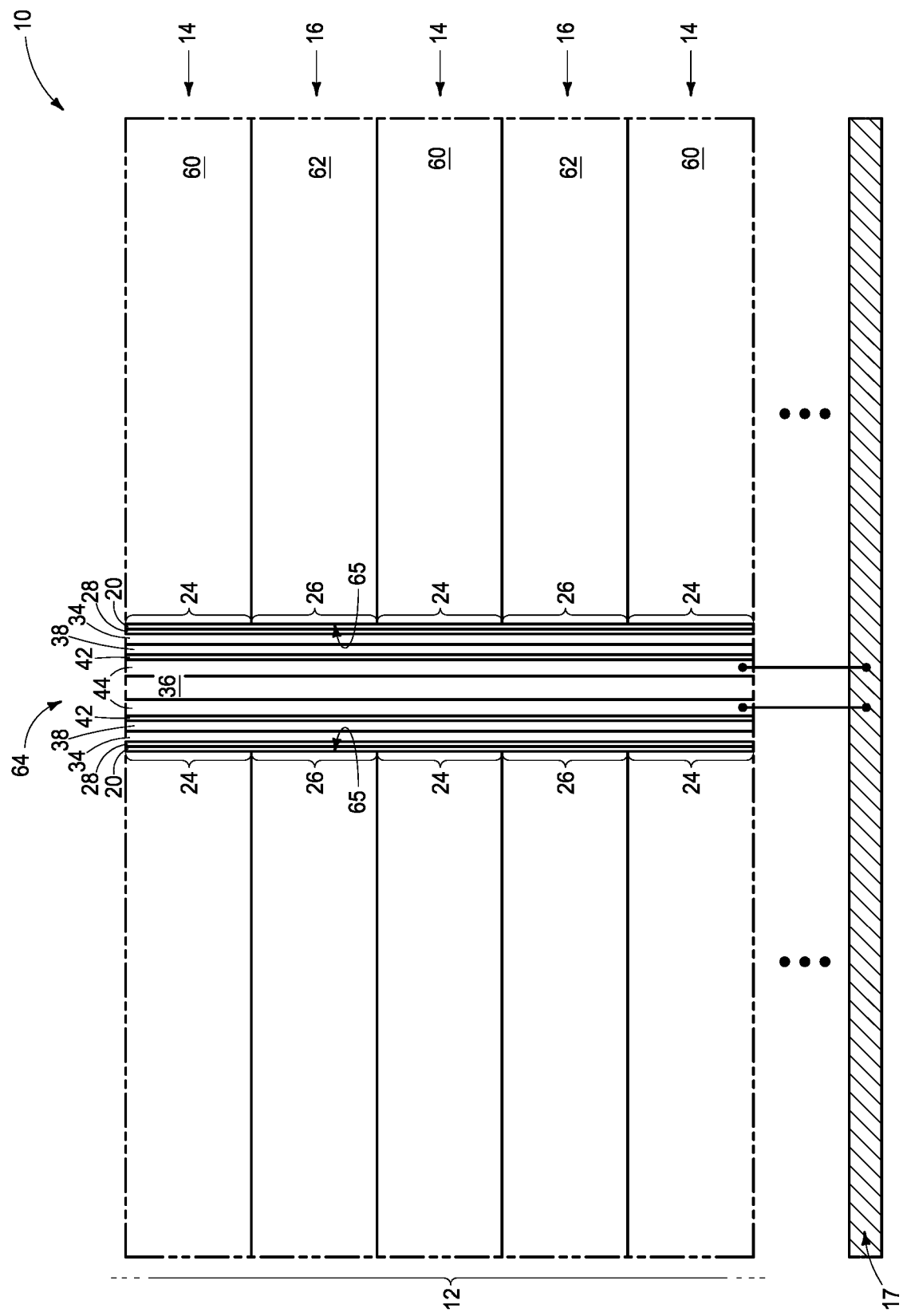

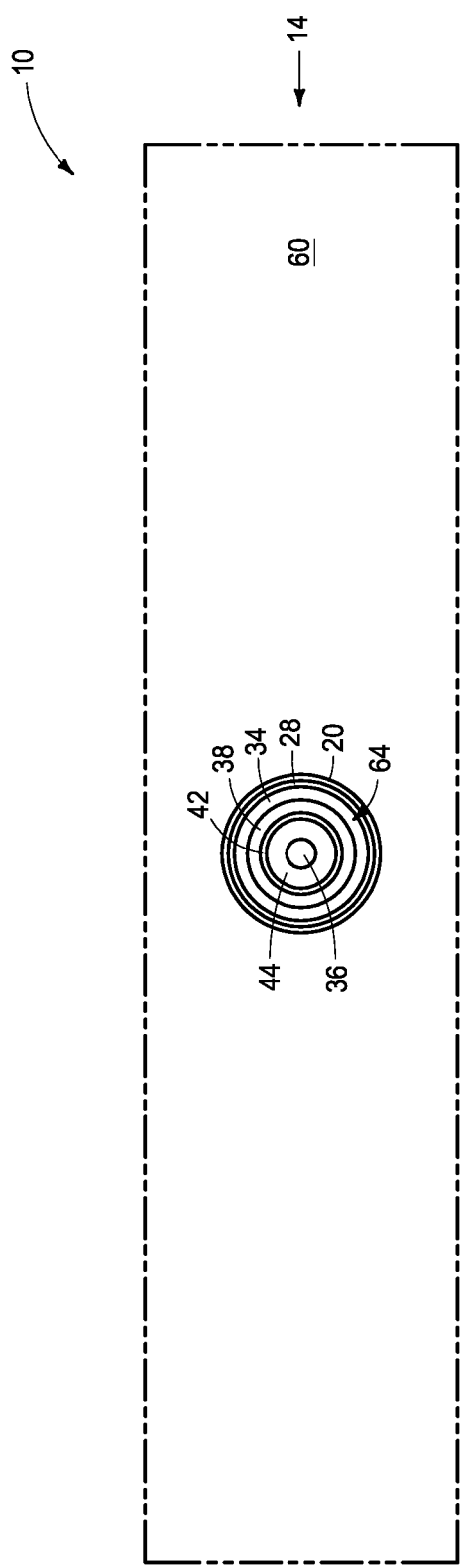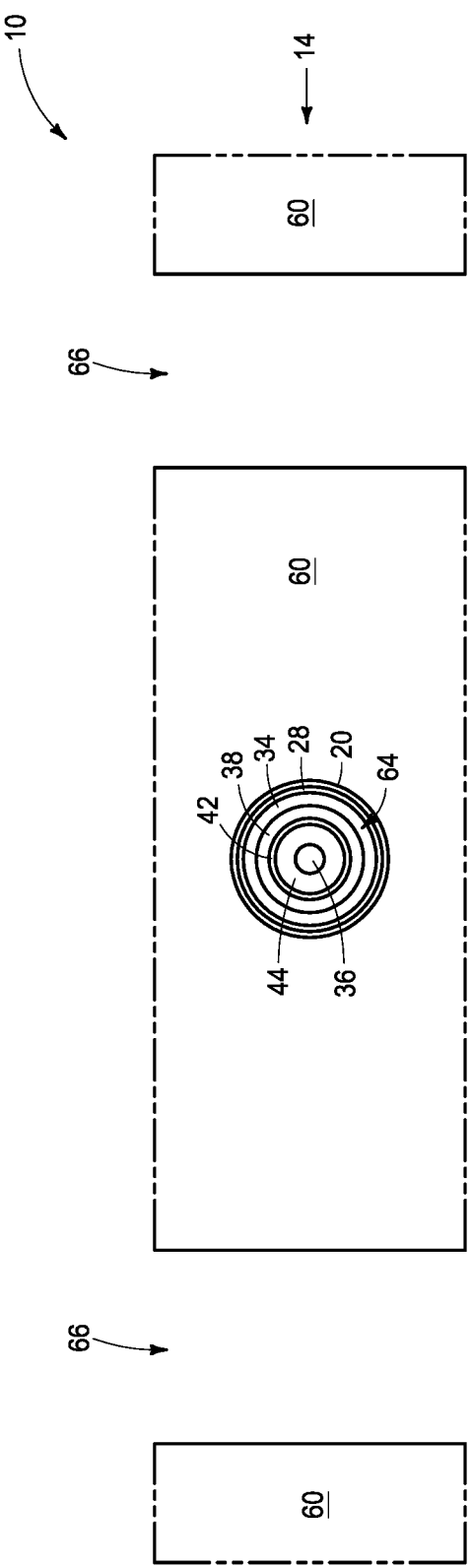

us 11,729,982 B2

INTEGRATED ASSEMBLIES AND METHODS OF FORMING INTEGRATED ASSEMBLIES

RELATED PATENT DATA

This patent resulted from a divisional of U.S. patent application Ser. No. 16/863,120 filed Apr. 30, 2020 which is hereby incorporated by reference herein.

TECHNICAL FIELD

Integrated assemblies (e.g., integrated NAND memory). Methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_J$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to develop improved NAND architecture and improved methods for fabricating NAND architecture.

BRIEF DESCRIPTION OF THE DRAWINGS

FIG. 7 is a diagrammatic cross-sectional side view of the region of the integrated assembly of FIG. 5 shown at an example process stage of an example method for forming an example NAND memory array. The process stage of FIG. 7 may follow that of FIG. 6.

FIG. 7A is a diagrammatic top-down view of a portion of the integrated assembly of FIG. 7.

FIG. 8A is a diagrammatic top-down view of a portion of the integrated assembly of FIG. 8.

DETAILED DESCRIPTION OF THE ILLUSTRATED EMBODIMENTS

It can be desired to have voids between conductive structures to reduce, or even eliminate, capacitive coupling and/or other cross-talk mechanisms between the conductive structures. Some embodiments include integrated assemblies having voids between conductive structures. Some embodiments include methods of forming integrated assemblies. Example embodiments are described with reference to FIGS. 5-20.

Figure 1:
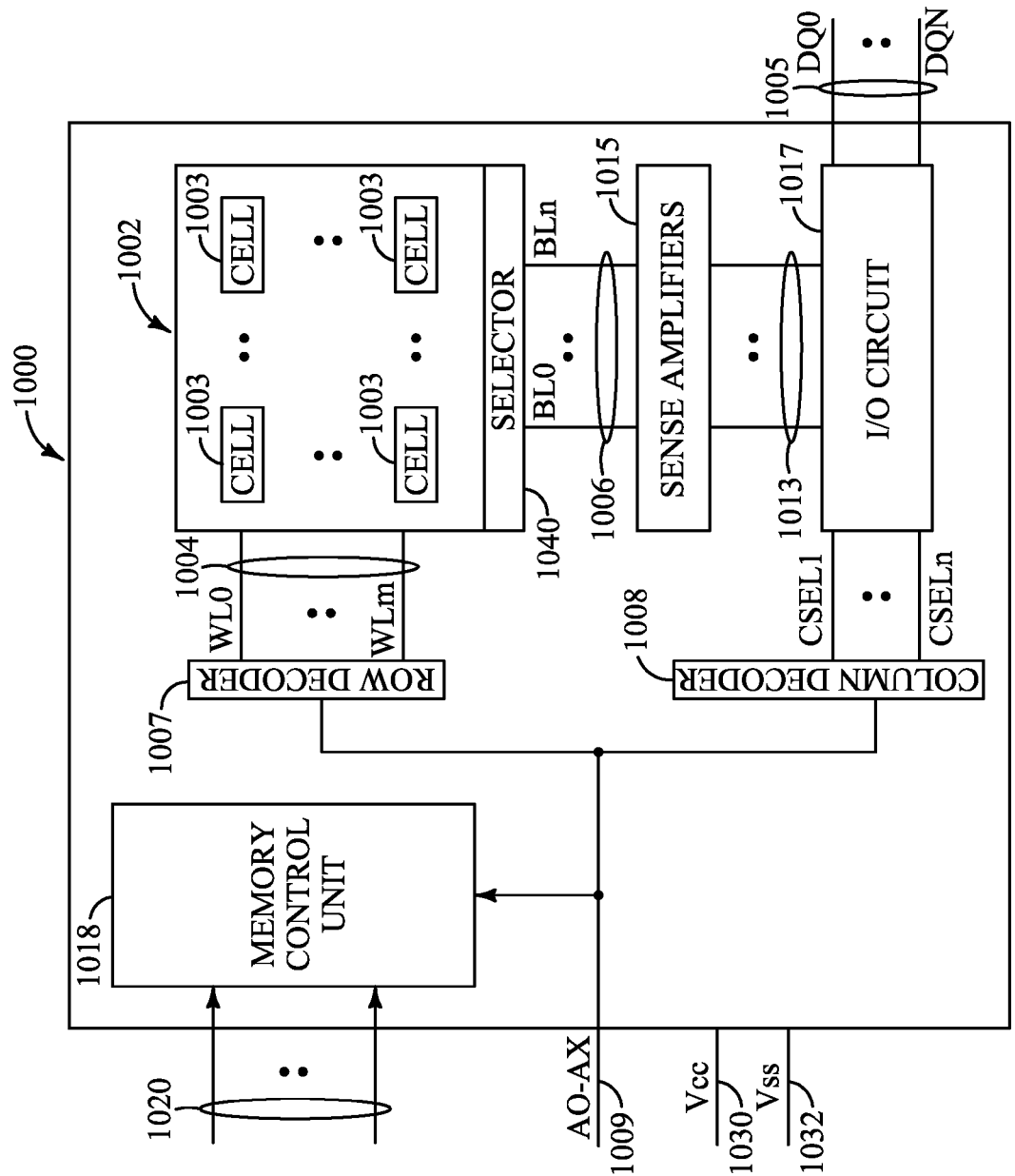
FIG. 1 shows a block diagram of a prior art memory device having a memory array with memory cells.
Figure 2:
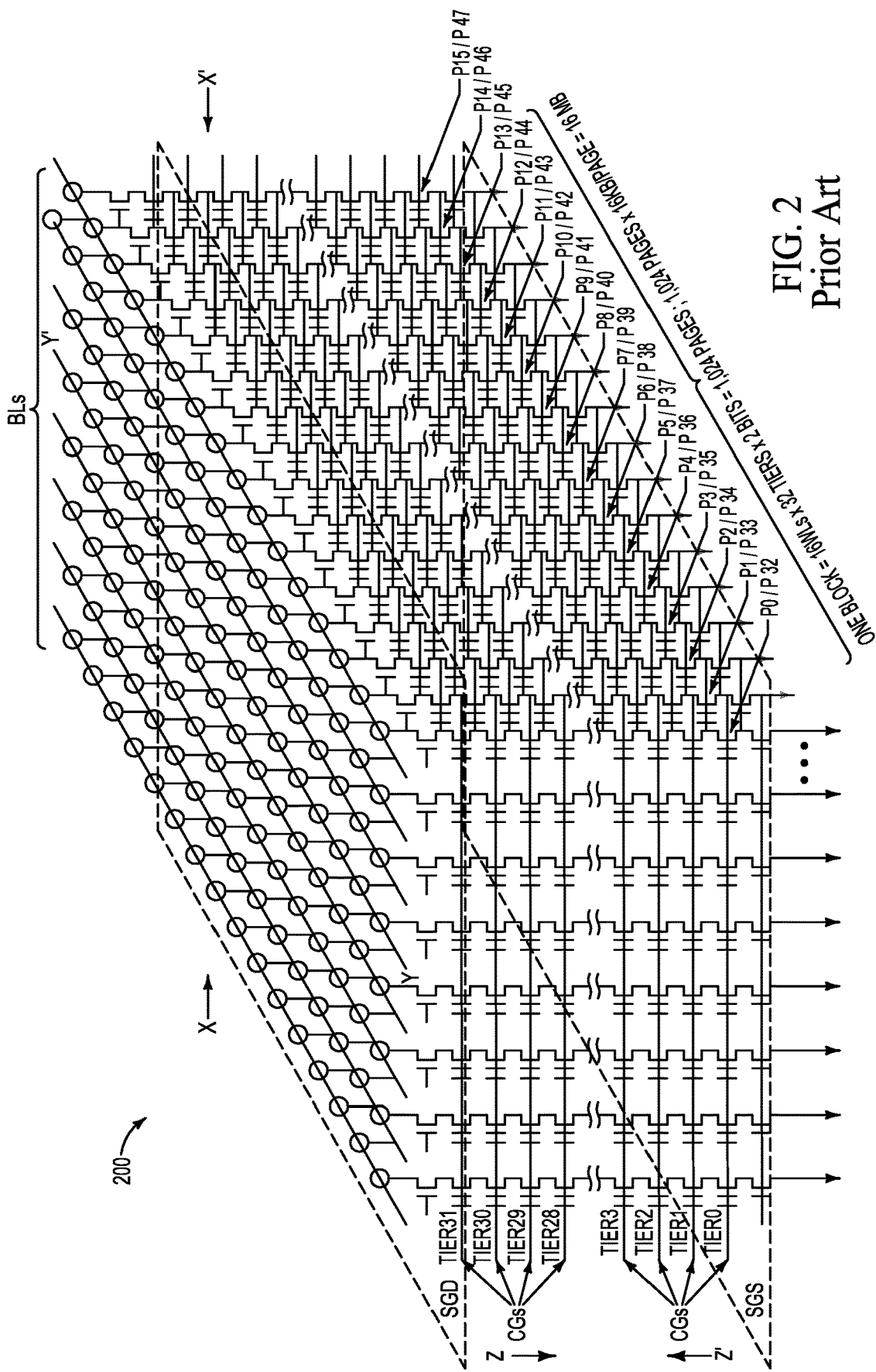
FIG. 2 shows a schematic diagram of the prior art memory array of FIG. 1 in the form of a 3D NAND memory device.
Figure 3:
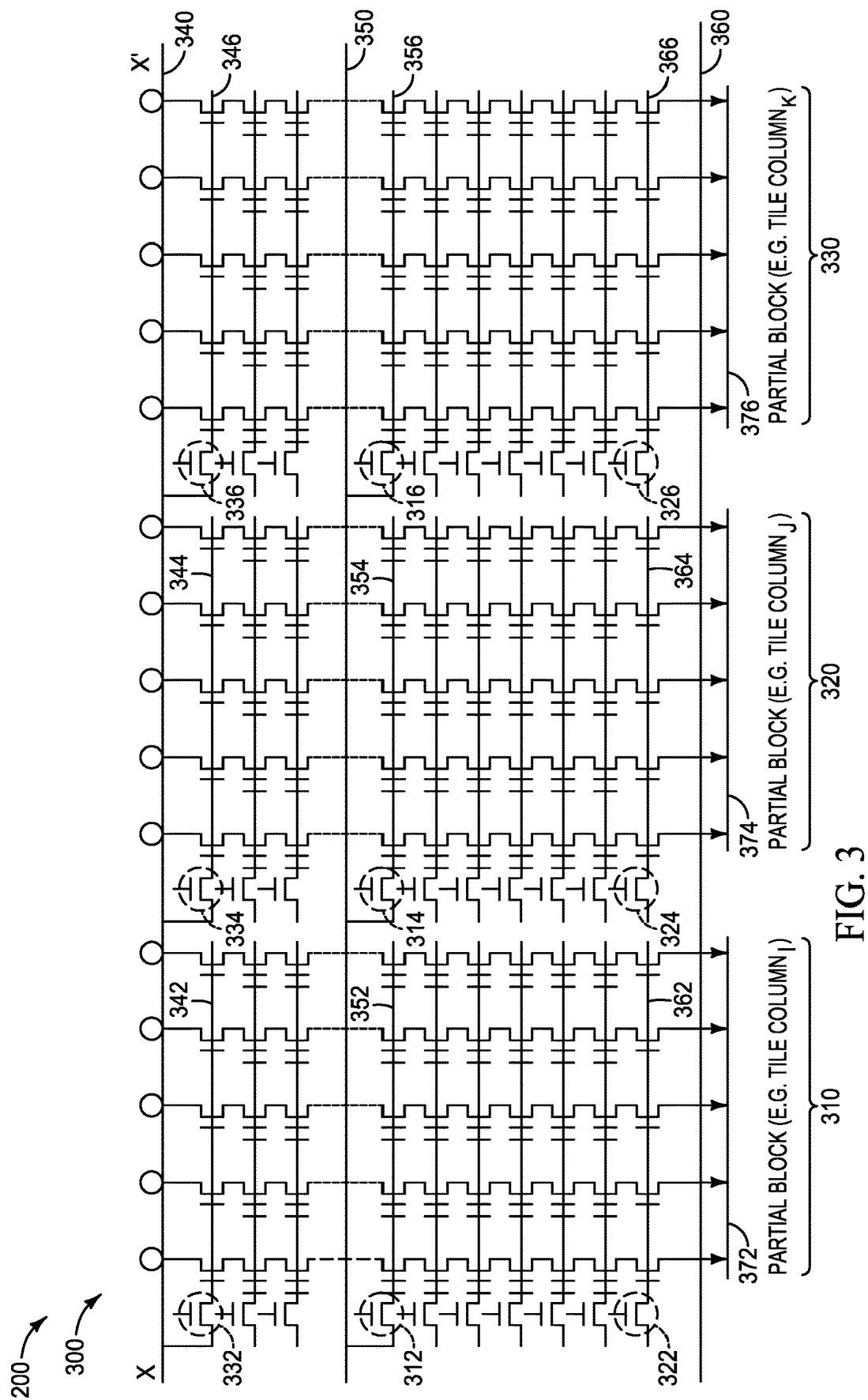
FIG. 3 shows a cross-sectional view of the prior art 3D NAND memory device of FIG. 2 in an X-X' direction.
Figure 4:
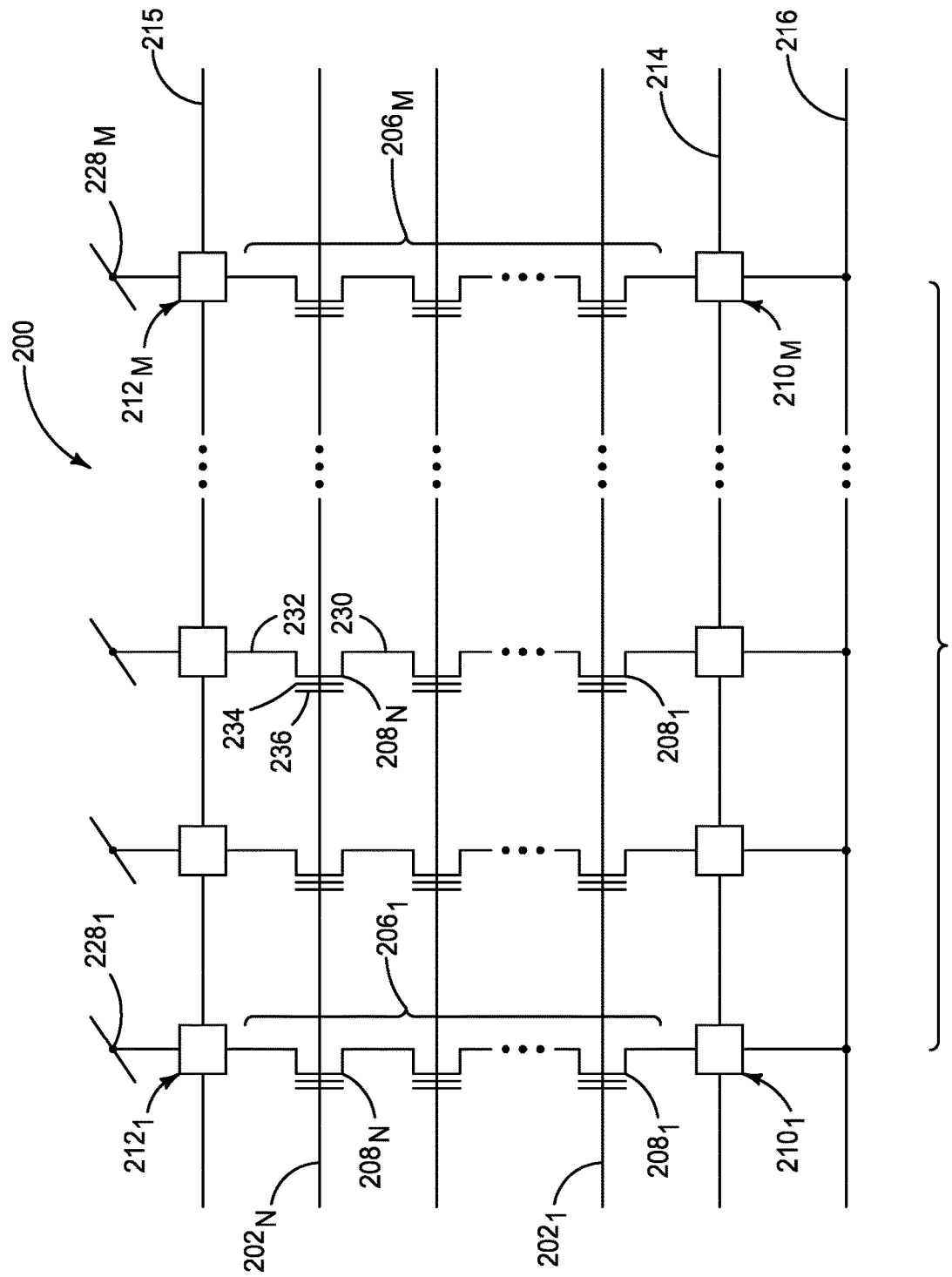
FIG. 4 is a schematic diagram of a prior art NAND memory array.
Figure 5:
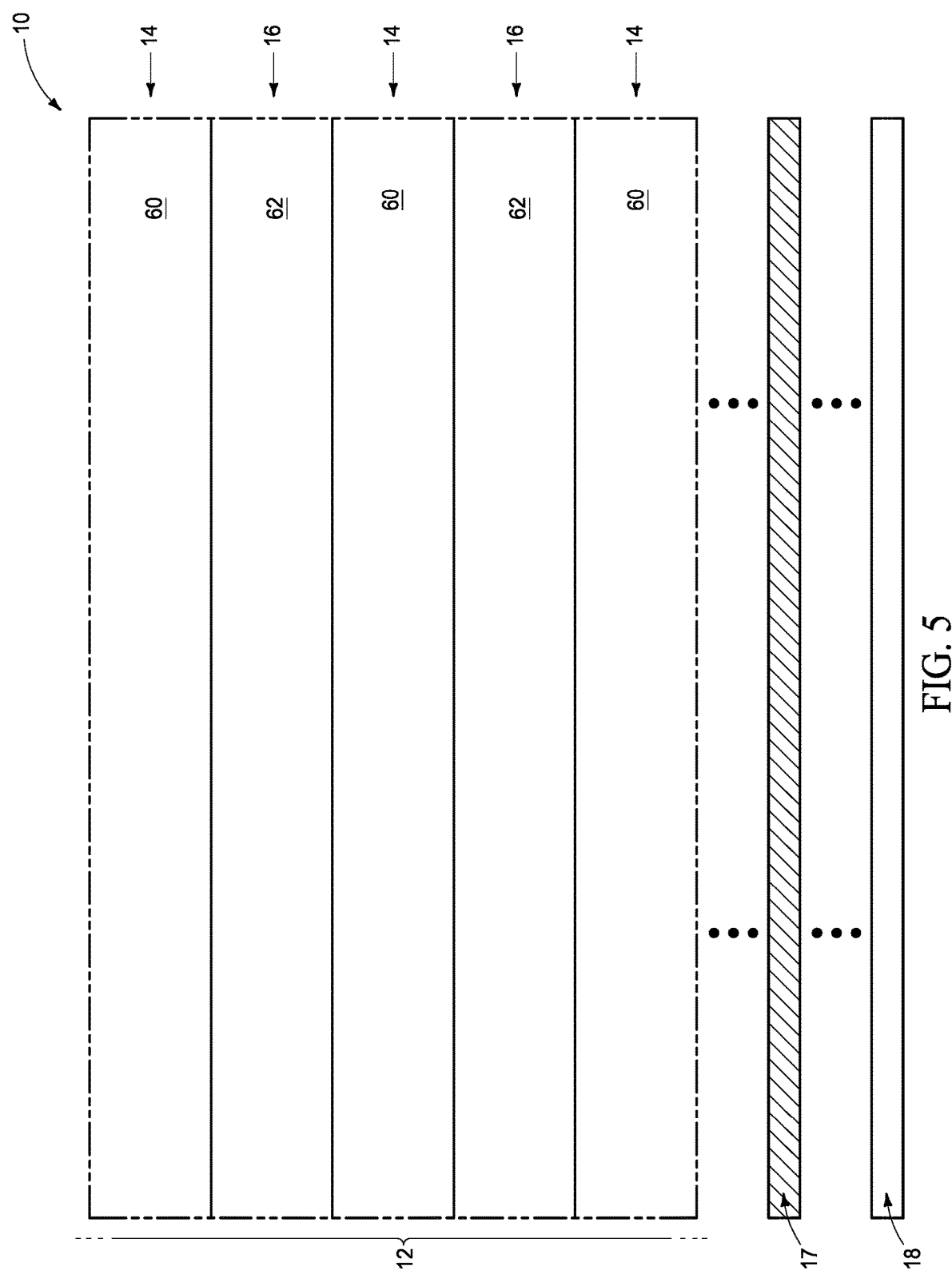
FIGS. 5 and 6 are diagrammatic cross-sectional side views of a region of an integrated assembly shown at example sequential process stages of an example method for forming an example NAND memory array.

Referring to FIG. 5, a construction (integrated assembly, integrated structure) 10 includes a vertical stack 12 of alternating first and second levels 14 and 16. The first levels 14 comprise a first material 60, and the second levels 16 comprise a second material 62. The first and second materials may comprise any suitable compositions, and are of different compositions relative to one another. In some embodiments, the first material 60 may comprise, consist essentially of, or consist of silicon dioxide; and the second material 62 may comprise, consist essentially of, or consist of silicon nitride. The levels 14 and 16 may be of any suitable thicknesses; and may be the same thickness as one another, or may be different thicknesses relative to one another. In some embodiments, the levels 14 and 16 may have vertical thicknesses within a range of from about 10 nanometers (nm) to about 400 nm. In some embodiments, the levels 14 and 16 may have vertical thicknesses within a range of from about 10 nm to about 50 nm. In some embodiments, the first and second levels 14 and 16 may have vertical thicknesses within a range of from about 15 nm to about 40 nm, within a range of from about 15 nm to about 20 nm, etc. There may be any suitable number of levels 14 and 16 within the stack 12. In some embodiments, there may be more than 10 of the levels within the stack, more than 50 of the levels within the stack, more than 100 of the levels within the stack, etc.

The stack 12 is shown to be supported by (formed over) a source structure 17, which in turn is supported by (formed over) a base 18.

The source structure 17 may correspond to source structures 214 and/or 360 described with reference to FIGS. 1-4, and may be a line, an expanse, or any other suitable configuration. The source structure 17 may comprise any suitable materials, and in some applications may comprise conductively-doped semiconductor material (e.g., conductively-doped silicon) over metal-containing material (e.g., tungsten silicide).

The base 18 may comprise semiconductor material; and may, for example, comprise, consist essentially of, or consist of monocrystalline silicon. The base 18 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 18 may correspond to a semiconductor substrate containing one or more materials associated with integrated circuit fabrication. Such materials may include, for example, one or more of refractory metal materials, barrier materials, diffusion materials, insulator materials, etc.

A gap is provided between the stack 12 and the source structure 17. The gap is utilized to indicate that other components and materials may be provided between the stack 12 and the source structure 17. Such other components and materials may comprise additional levels of the stack, source-side select gates (SGSs), etc. Similarly, a gap is provided between the source structure 17 and the base 18 to indicate that other components and materials may be provided between the source structure 17 and the base 18.

Figure 6:
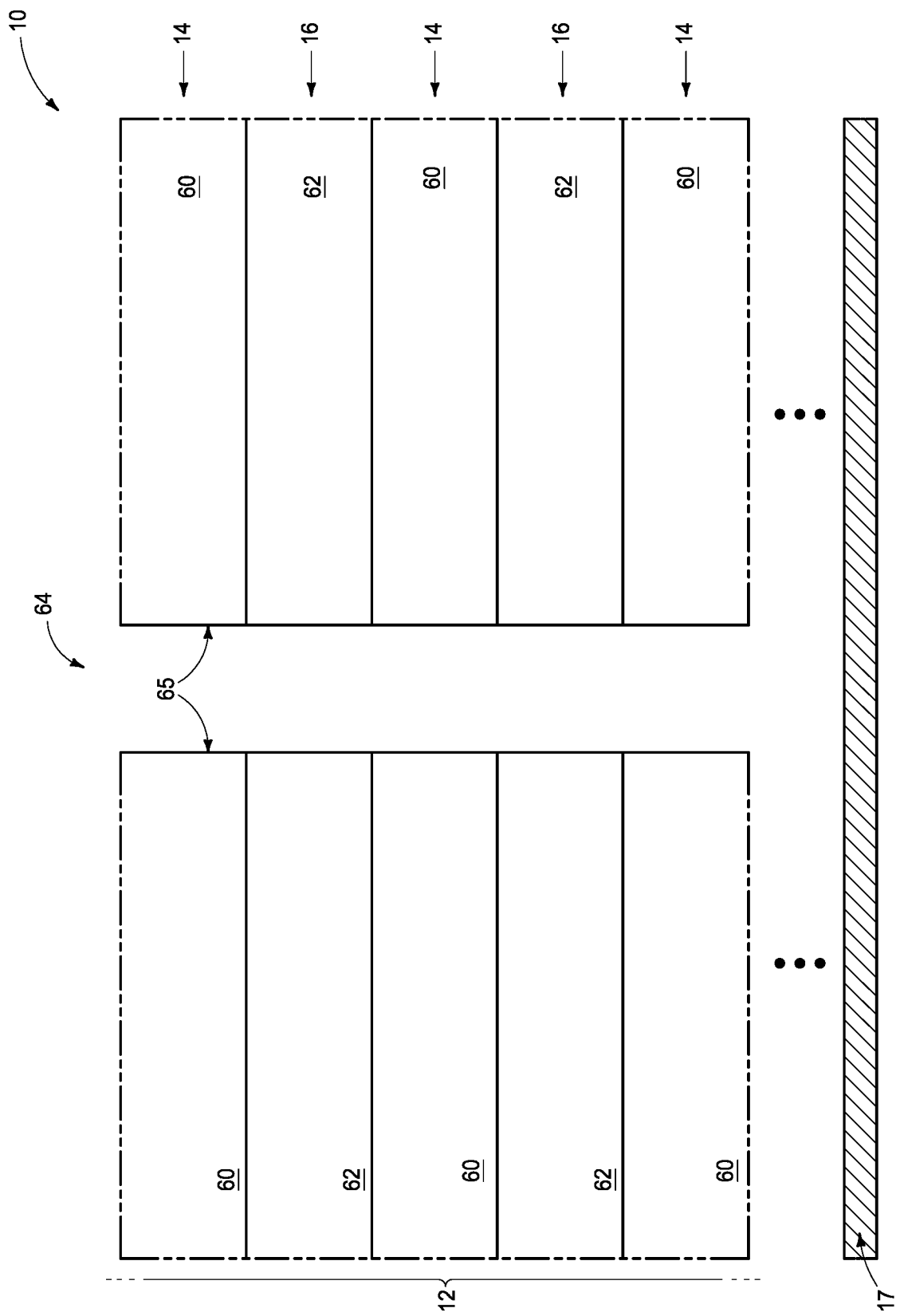

Referring to FIG. 6, an opening 64 is formed to extend through the stack 12. The opening 64 has sidewalls 65 extending along the first and second materials 60 and 62. The base 18 (FIG. 5) is not shown in FIG. 6, or in any of the figures following FIG. 6, in order to reduce the size of the figures. It is to be understood that the base would remain in the assembly 10 of FIG. 6, and in the assemblies shown in the figures following FIG. 6.

Figure 6A:
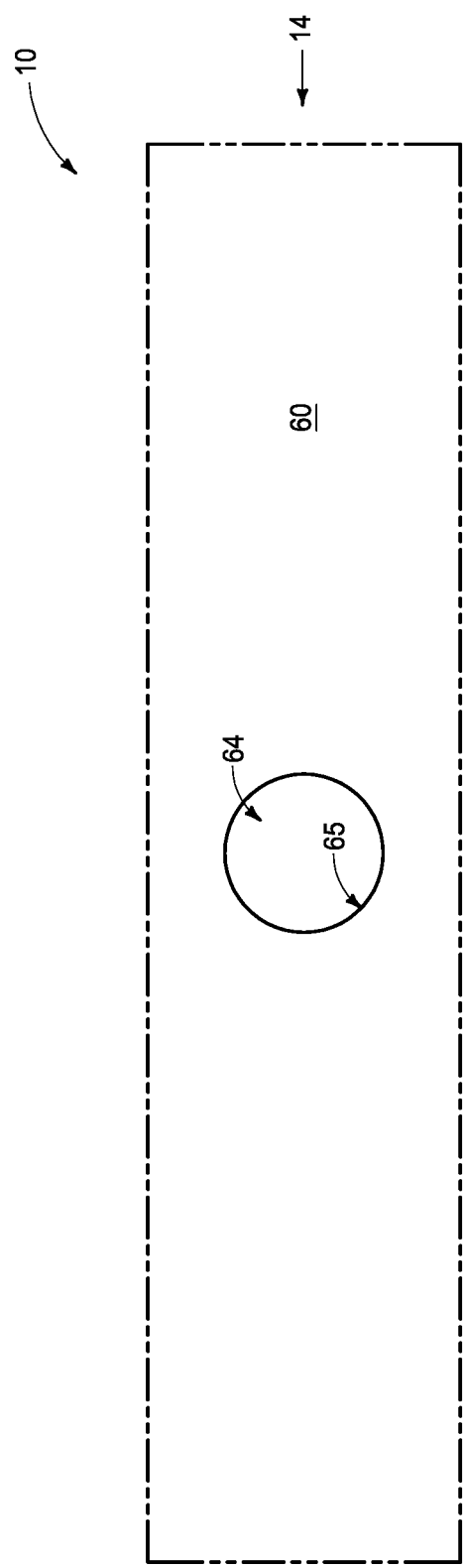
FIG. 6A is a diagrammatic top-down view of a portion of the integrated assembly of FIG. 6.

FIG. 6A is a top-down view through one of the levels 14 of a region of the assembly 10 at the process stage of FIG. 6, and shows that the opening 64 may have a closed shape (circular, elliptical, square or other polygonal, etc.) when viewed from above. In the illustrated embodiment, the opening 64 is circular when viewed from above. The sidewalls 65 along the cross-section of FIG. 6 are part of a continuous sidewall 65, as shown by the top view of FIG. 6A. The sidewall 65 may be referred to as a peripheral sidewall of the opening, or as a peripheral sidewall surface of the opening. The terms "peripheral sidewall" and "peripheral sidewall surface" may be utilized interchangeably. The utilization of one term or the other may be to provide language variation within this disclosure to simplify antecedent basis within the claims that follow.

The opening 64 may be representative of a large number of substantially identical openings formed at the process stage of FIGS. 6 and 6A. The term "substantially identical" means identical to within reasonable tolerances of fabrication and measurement.

Referring to FIGS. 7 and 7A (with FIG. 7A being a top-down view through one of the levels 14 of FIG. 7), a liner 20 is formed along the peripheral sidewall 65 to line the opening 64. The liner comprises a liner material. The liner material may function as an etch-stop in subsequent processing, and may comprise any suitable composition(s). In some embodiments, the liner material may be a carbon-containing material. For instance, the liner material may comprise, consist essentially of, or consist of carbon in combination with one or more of silicon, oxygen and nitrogen. In some embodiments, the liner material may comprise, consist essentially of, or consist of SiOC, where the chemical formula indicates primary constituents rather than a specific stoichiometry; and wherein the carbon is present to a concentration within a range of from about 1 atomic percent (at %) to about 50 at %. In some embodiments, the carbon may be present in the SiOC to a concentration within a range of from about 4 at % to about 20 at %. In some embodiments, the liner material may comprise, consist essentially of, or consist of SiC, where the chemical formula indicates primary constituents rather than a specific stoichiometry; and wherein the carbon is present to a concentration within a range of from about 1 at % to about 50 at %. In some embodiments, the carbon may be present in the SiC to a concentration within a range of from about 4 at % to about 20 at %. In some embodiments, the liner material may comprise, consist essentially of, or consist of SiNC, where the chemical formula indicates primary constituents rather than a specific stoichiometry; and wherein the carbon is present to a concentration within a range of from about 1 part per million (ppm) to about 5 at %. In some embodiments, the liner material may comprise, consist essentially of, or consist of one or more metals (e.g., one or both of tungsten and ruthenium).

The liner 20 may comprise any suitable thickness. In some embodiments such thickness may be within a range of from about 1 nm to about 12 nm; within a range of from about 2 nm to about 4 nm; etc.

Although the liner 20 is shown to have a single homogenous composition, in other embodiments (not shown) the liner 20 may comprise a laminate of two or more different compositions.

The liner 20 may be considered to have first regions 24 along the first levels 14, and to have second regions 26 along the second levels 16.

The liner 20 may be referred to as a first liner.

High-k dielectric material (dielectric-barrier material) 28 is formed along the liner 20 (adjacent the liner 20). The dielectric-barrier material 28 may be considered to be adjacent the sidewall 65 of the opening 64 even though it is spaced from the sidewall by the liner 20 in the shown embodiment. The term "high-k" means a dielectric constant greater than that of silicon dioxide. In some embodiments, the high-k dielectric material 28 may comprise, consist essentially of, or consist of one or more of aluminum oxide (AlO), hafnium oxide (HfO), hafnium silicate (HfSiO), zirconium oxide (ZrO) and zirconium silicate (ZrSiO); where the chemical formulas indicate primary constituents rather than specific stoichiometries.

The high-k dielectric material 28 has a substantially uniform thickness, with the term "substantially uniform" meaning uniform to within reasonable tolerances of fabrication and measurement. The high-k dielectric material 28 may be formed to any suitable thickness; and in some embodiments may be formed to a thickness within a range of from about 1 nm to about 5 nm.

Charge-blocking material 34 is formed along the dielectric-barrier material 28. The charge-blocking material 34 may comprise any suitable composition(s); and in some embodiments may comprise, consist essentially of, or consist of one or both of silicon oxynitride (SiON) and silicon dioxide ($SiO_2$).

Charge-storage material 38 is formed adjacent the charge-blocking material 34. The charge-storage material 38 may comprise any suitable composition(s). In some embodiments the charge-storage material 38 may comprise one or more charge-trapping materials; such as, for example, one or more of silicon nitride, silicon oxynitride, conductive nanodots, etc. For instance, in some embodiments the charge-storage material 38 may comprise, consist essentially of, or consist of silicon nitride.

The charge-storage material 38 has a flat configuration in the illustrated embodiment of FIG. 7. The term "flat configuration" means that the material 38 is of substantially continuous thickness and extends substantially vertically straight, as opposed to being undulating.

Gate-dielectric material (i.e., tunneling material, charge-passage material) 42 is formed adjacent the charge-storage material 38. The gate-dielectric material 42 may comprise any suitable composition(s). In some embodiments, the gate-dielectric material 42 may comprise, for example, one or more of silicon dioxide, silicon nitride, silicon oxynitride, aluminum oxide, hafnium oxide, zirconium oxide, etc. The gate-dielectric material 42 may be bandgap-engineered to achieve desired electrical properties; and accordingly may comprise a combination of two or more different materials.

Channel material 44 is formed adjacent the gate-dielectric material 42, and extends vertically along (through) the stack 12. The channel material 44 comprises semiconductor material; and may comprise any suitable composition or combination of compositions. For instance, the channel material 44 may comprise one or more of silicon, germanium, III/V semiconductor materials (e.g., gallium phosphide), semiconductor oxides, etc.; with the term III/V semiconductor material referring to semiconductor materials comprising elements selected from groups III and V of the periodic table (with groups III and V being old nomenclature, and now being referred to as groups 13 and 15). In some embodiments, the channel material 44 may comprise, consist essentially of, or consist of silicon.

Insulative material 36 is formed adjacent the channel material 44, and fills a remaining portion of the opening 64 (FIG. 6). The insulative material 36 may comprise any suitable composition(s); and in some embodiments may comprise, consist essentially of, or consist of silicon dioxide.

In the illustrated embodiment of FIGS. 7 and 7A, the channel material 44 is configured as an annular ring which surrounds the insulative material 36. Such configuration of the channel material may be considered to comprise a hollow channel configuration, in that the insulative material 36 is provided within a "hollow" in the annular-ring-shaped channel configuration. In other embodiments (not shown), the channel material may be configured as a solid pillar configuration.

The channel material 44 is shown to be electrically coupled with the source structure 17 in the cross-sectional view of FIG. 7. Such electrically coupling may be accomplished with any suitable configuration. For instance, in some embodiments the channel material 44 may directly contact the source structure 17.

Figure 8:
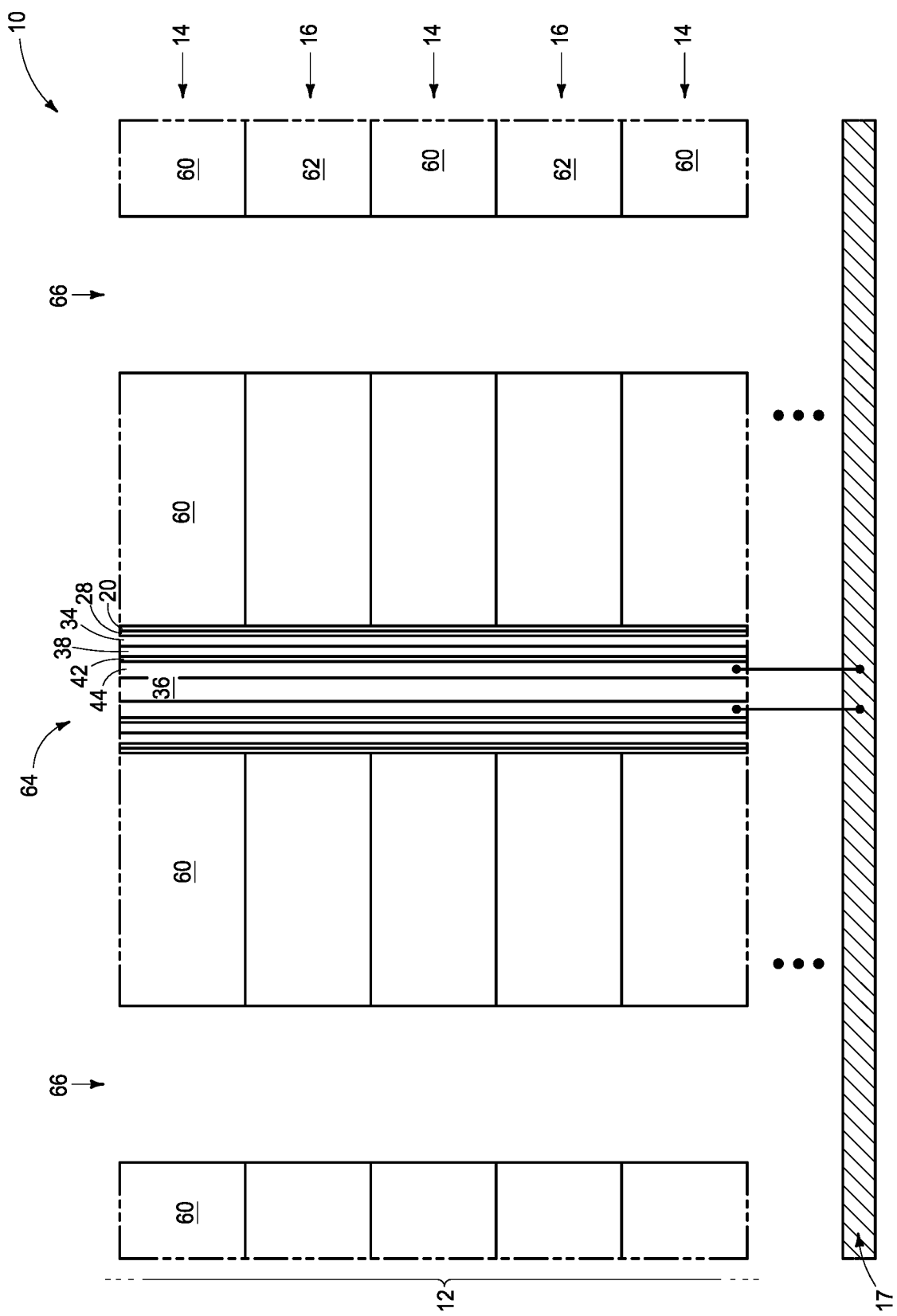
FIG. 8 is a diagrammatic cross-sectional side view of the region of the integrated assembly of FIG. 5 shown at an example process stage of an example method for forming an example NAND memory array. The process stage of FIG. 8 may follow that of FIG. 7.

Referring to FIGS. 8 and 8A (with FIG. 8A being a top-down view through one of the levels 14 of FIG. 8), slits 66 are formed to extend through the stack 12. The slits 66 may be utilized to separate memory block regions from one another in some embodiments.

Figure 9:
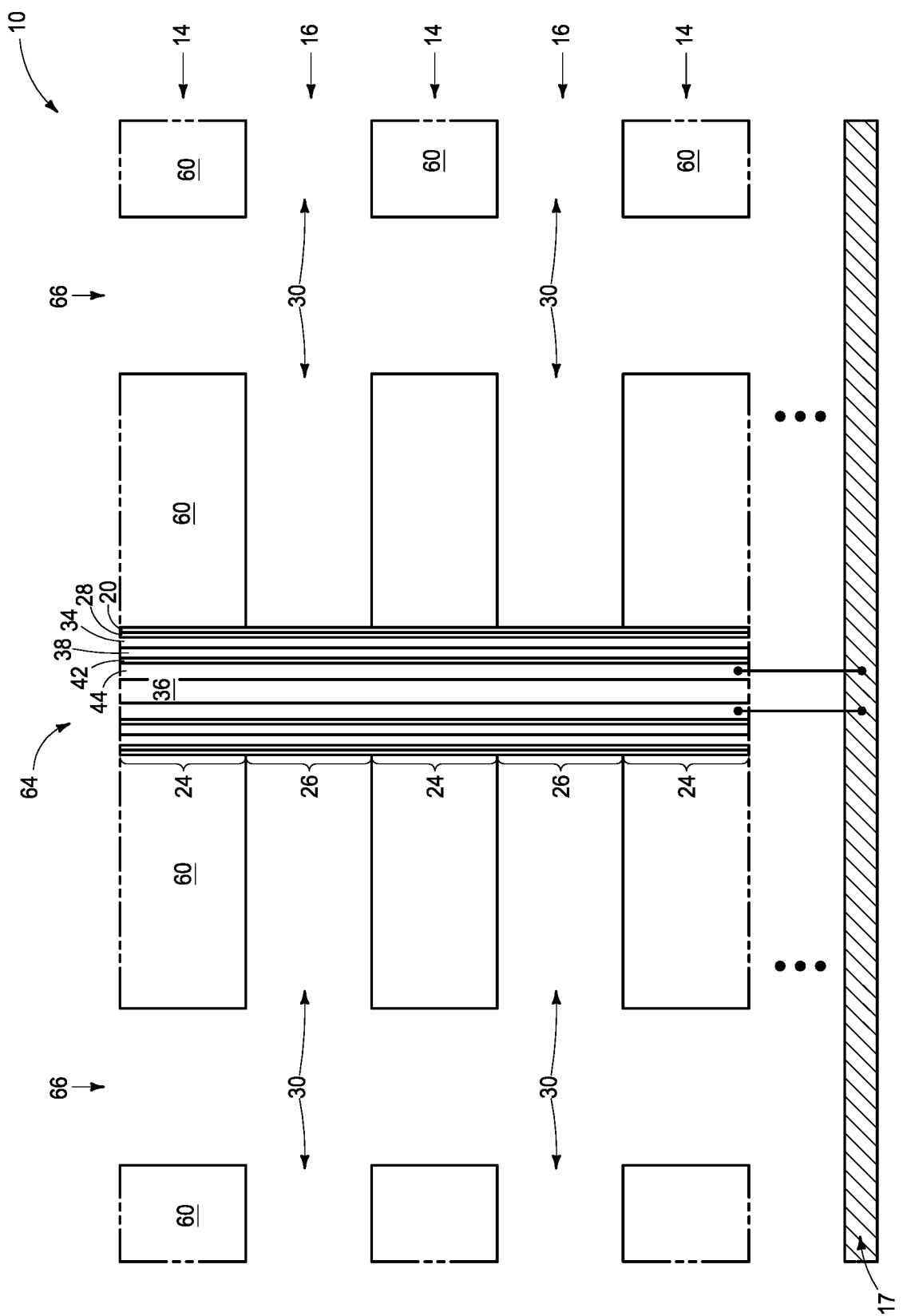
FIGS. 9-19 are diagrammatic cross-sectional side views of the region of the integrated assembly of FIG. 5 shown at example sequential process stages of an example method for forming an example NAND memory array. The process stage of FIG. 9 may follow that of FIG. 8.

Referring to FIG. 9, the second material 62 (FIG. 8) is removed to leave voids 30 along the second levels 16 (i.e., between the first levels 14). The voids 30 may be referred to as first voids.

The voids 30 may be formed with any suitable process which removes the material 62 (FIG. 8) selectively relative to the materials 60 and 20. In some embodiments such process may utilize etchant (e.g., hot phosphoric acid) flowed into the slits 66.

The second regions 26 of the liner 20 are exposed by the voids 30.

Figure 10:
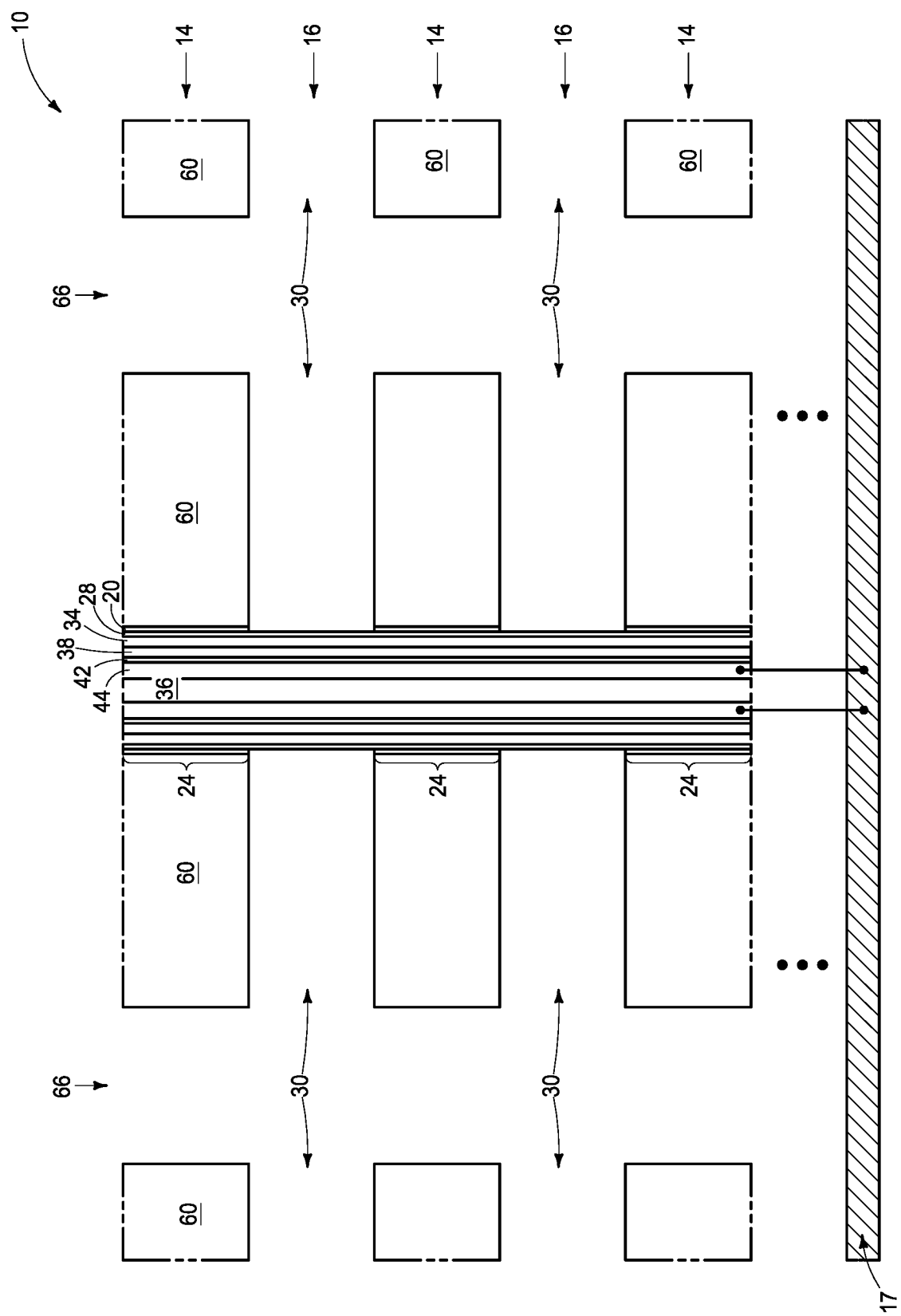

Referring to FIG. 10, the exposed second regions 26 (FIG. 9) of the liner 20 are removed. Such removal may comprise any suitable processing. In some embodiments, the removal may comprise oxidation of the exposed regions of the liner (e.g., exposure of such regions to one or more of $O_2$, $H_2O_2$, $O_3$, etc.), followed by removal of the oxidized regions with suitable chemistry/conditions (e.g., an appropriate etchant). In some embodiments, the removal of the liner 20 utilizes an etchant comprising HF, the insulative material 60 of levels 14 comprises silicon dioxide, and the etchant thins insulative material 60 of the levels 14 (i.e., vertically expands the voids 30).

The removal of the second regions 26 of the liner 20 exposes the dielectric-barrier material 28 along the levels 16.

Figure 11:
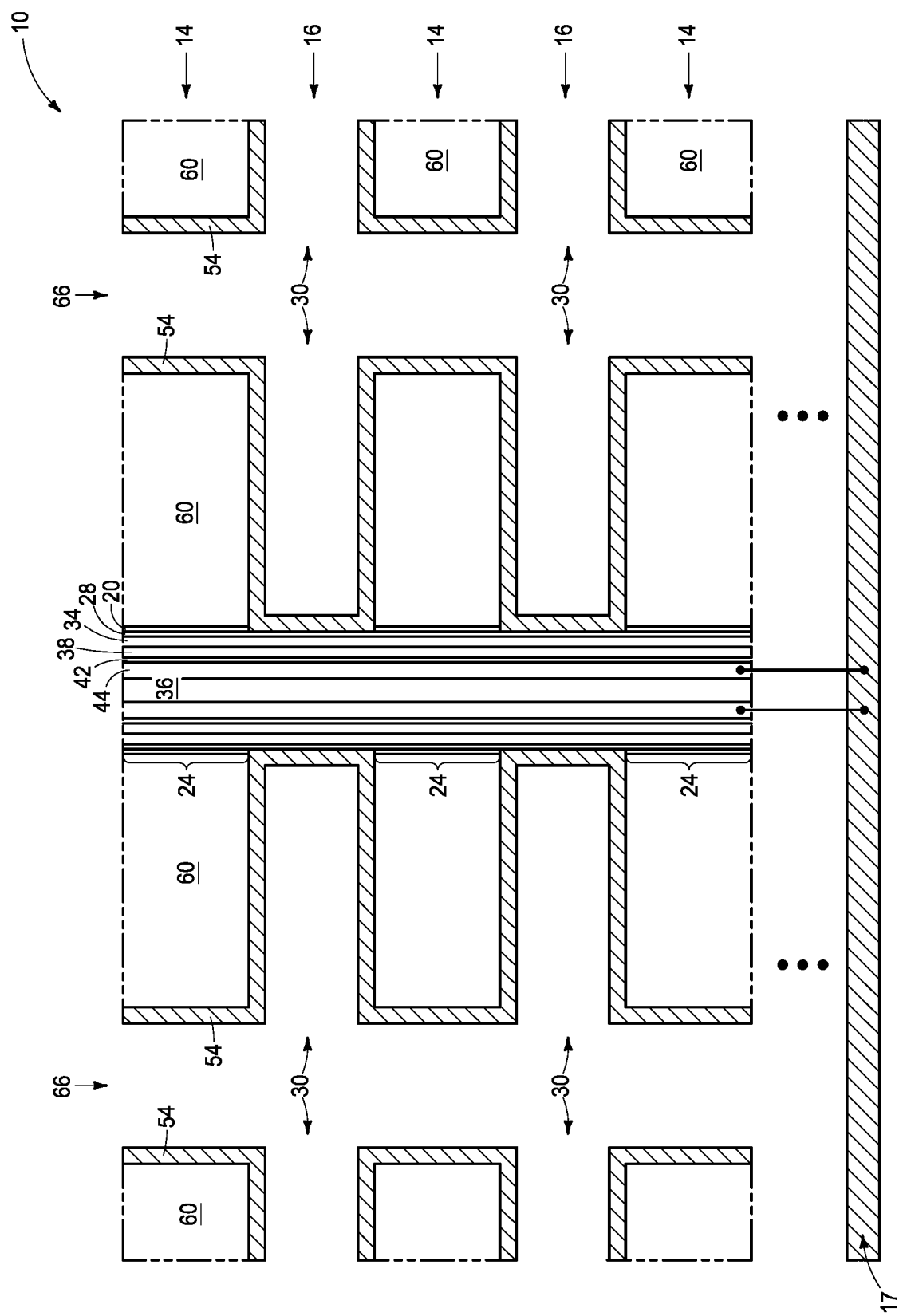

Referring to FIG. 11, conductive material 54 is formed within the voids 30 to line the voids, and in the shown embodiment is formed to be directly against the high-k dielectric material 28. The conductive material 54 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, conductive material 54 may comprise one or more metal nitrides (e.g., may comprise titanium nitride, tungsten nitride, etc.).

Figure 12:
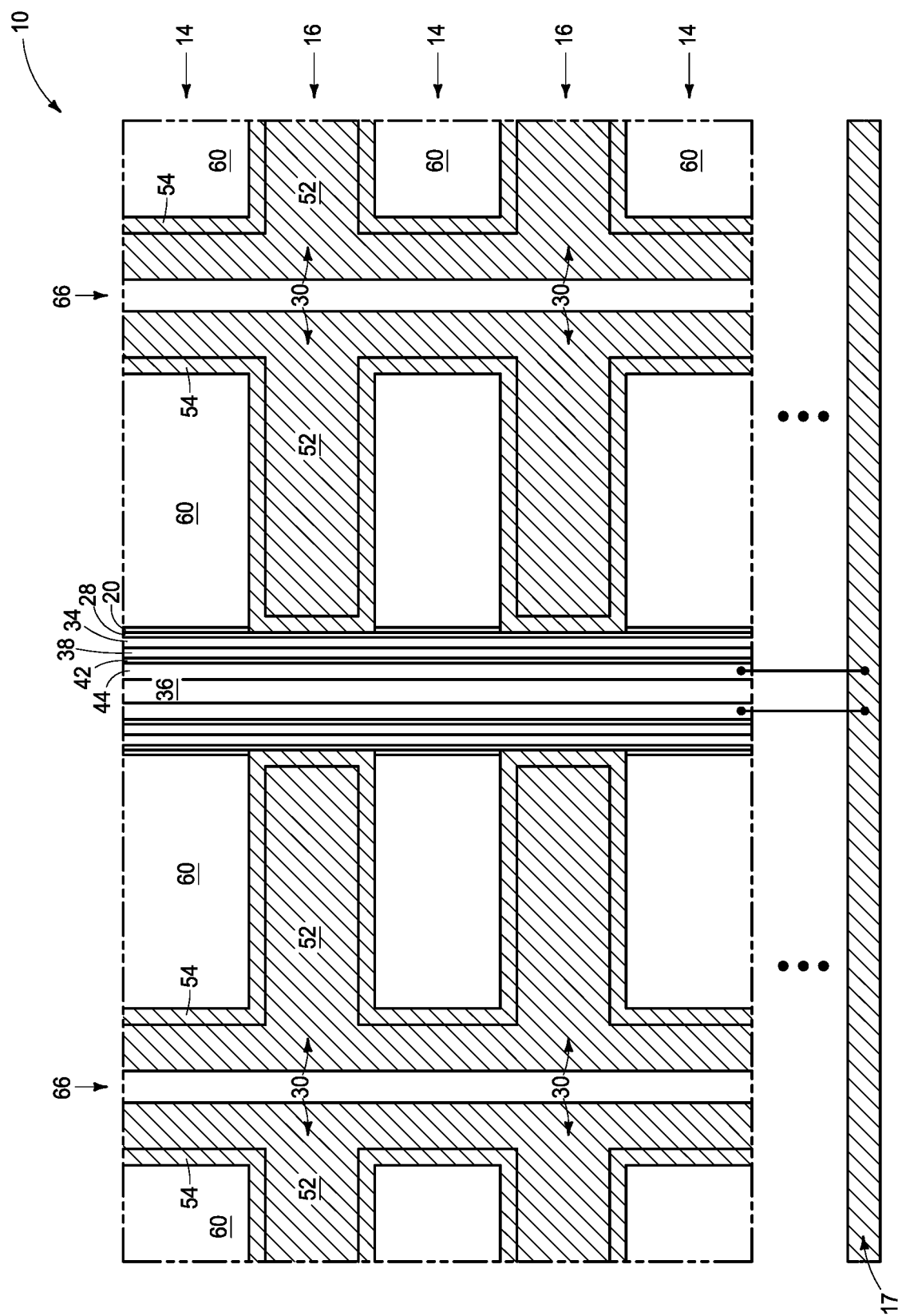

Referring to FIG. 12, conductive material 52 is formed within the lined voids 30. The conductive material 52 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 52 may comprise one or more metals (e.g., may comprise tungsten).

The conductive material 52 is compositionally different from the conductive material 54. In some embodiments, the material 52 may be referred to as a conductive core material (or as a metal-containing core material), and the material 54 may be referred to as a conductive liner material (or as a metal-nitride-containing liner material). The conductive liner material 54 is along an outer periphery of the conductive core material 52.

Figure 13:
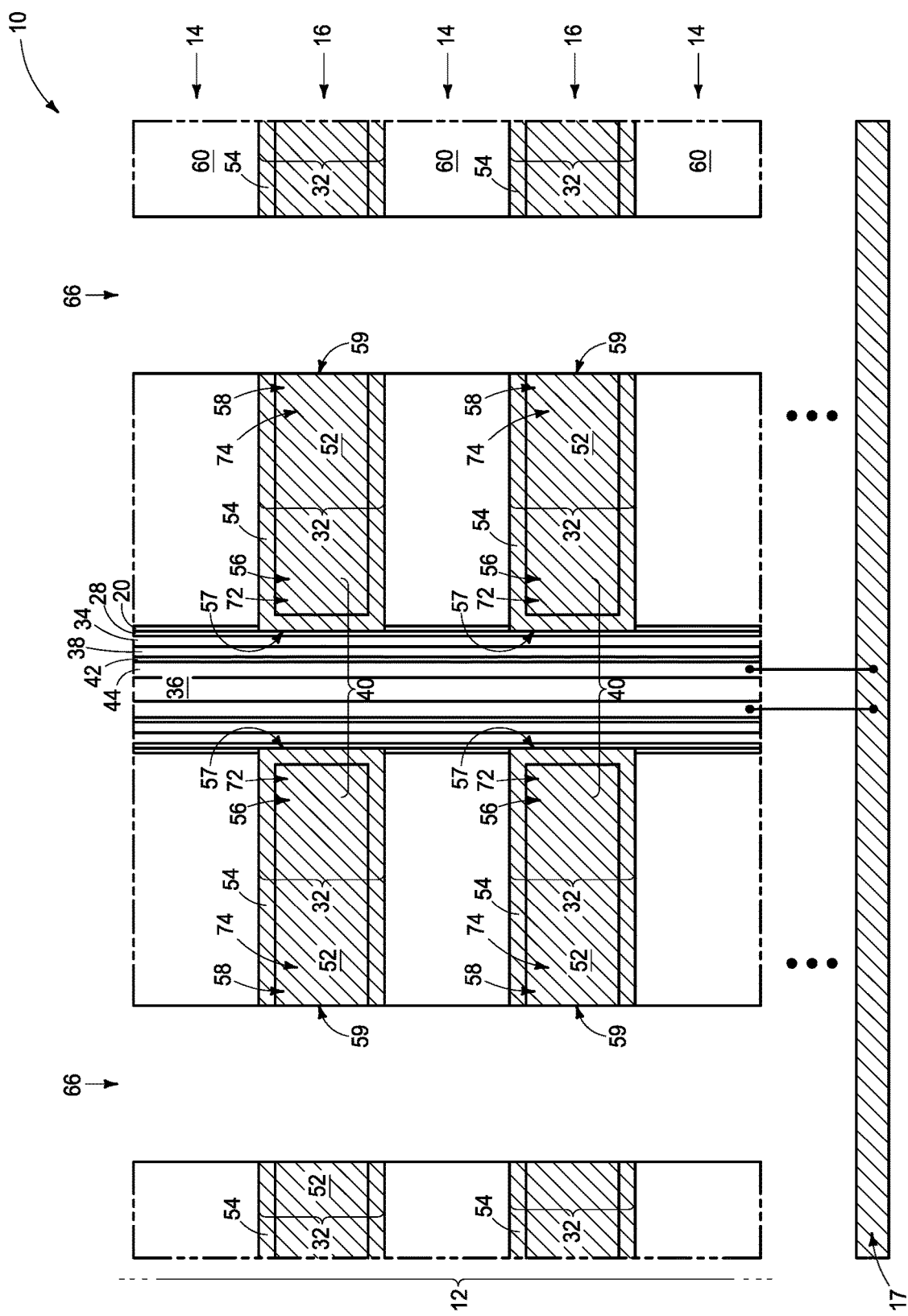

Referring to FIG. 13, the materials 52 and 54 are removed from within the slits 66 with appropriate etching (e.g., anisotropic etching). The remaining regions of the materials 52 and 54 are configured as conductive structures 32, with such conductive structures being within the voids 30 (FIG. 9) and being along the levels 16. The levels 16 may be considered to be conductive levels at the process stage of FIG. 13, with such conductive levels comprising the conductive structures 32. The conductive levels 16 alternate with the insulative levels 14 in the vertical stack 12 at the process stage of FIG. 13.

The conductive structures 32 have proximal regions 56 adjacent the dielectric-barrier material 28, and have distal regions 58 in opposing relation to the proximal regions 56. In some embodiments, the proximal regions 56 of the conductive structures 32 may be considered to have proximal ends 57 adjacent the channel material 44 (and in the shown embodiment, directly against the dielectric-barrier material 28), and the distal regions 58 of the conductive structures 32 may be considered to have distal ends 59 adjacent the slits 66.

The conductive levels 16 may be considered to be memory cell levels (also referred to herein as wordline levels) of a NAND configuration. The NAND configuration includes strings of memory cells (i.e., NAND strings), with the number of memory cells in the strings being determined by the number of vertically-stacked levels 16. The NAND strings may comprise any suitable number of memory cell levels. For instance, the NAND strings may have 8 memory cell levels, 16 memory cell levels, 32 memory cell levels, 64 memory cell levels, 512 memory cell levels, 1024 memory cell levels, etc. The stack 12 is indicated to extend vertically beyond the illustrated region to show that there may be more vertically-stacked levels than those specifically illustrated in the diagram of FIG. 13.

NAND memory cells 40 comprise the dielectric-barrier material 28, charge-blocking material 34, charge-storage material 38, gate-dielectric material 42 and channel material 44. The illustrated NAND memory cells 40 form a portion of a vertically-extending string of memory cells. Such string may be representative of a large number of substantially identical NAND strings formed during fabrication of a NAND memory array (with the term "substantially identical" meaning identical to within reasonable tolerances of fabrication and measurement).

Each of the NAND memory cells 40 includes a control gate region 72 within a conductive structure 32 along a conductive level 16. The control gate regions 72 comprise control gates analogous to those described above with reference to FIGS. 1-4. The conductive structures 32 also comprise regions 74 adjacent to (proximate) the control gate regions 72. The regions 74 may be referred to as routing regions (wordline regions). The control gate regions 72 include the proximal regions 56 of the conductive structures 32, and the routing regions 74 include the distal regions 58 of the conductive structures 32.

Figure 14:
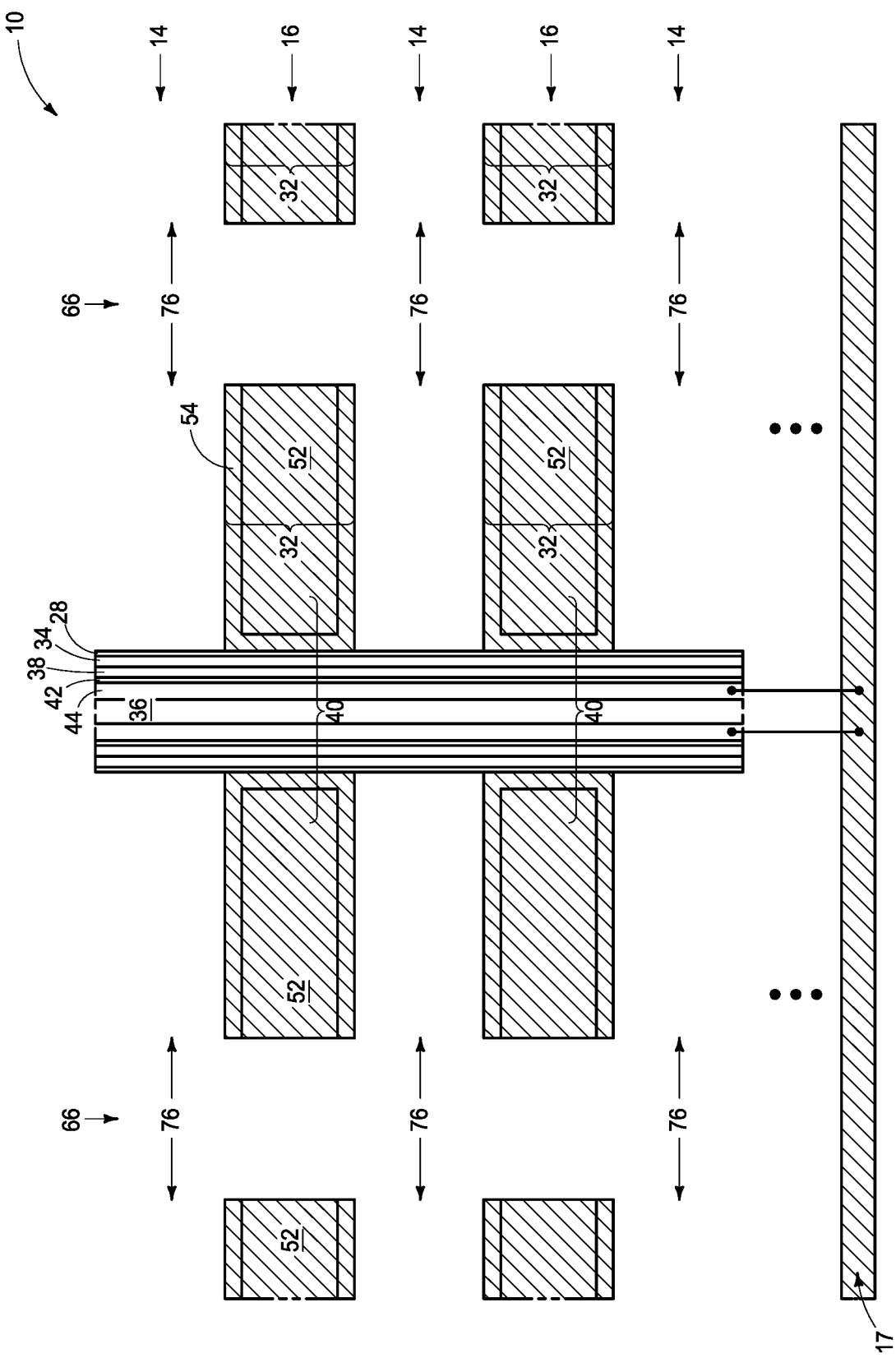

Referring to FIG. 14, the first material 60 (FIG. 13) is removed to form second voids 76 (i.e., to leave the second voids 76) along the levels 14, and in the shown embodiment the first regions 24 (FIG. 9) of the liner 20 (FIG. 9) are removed during the formation of the second voids 76. The second voids 76 are vertically between the conductive structures 32.

Figure 15:
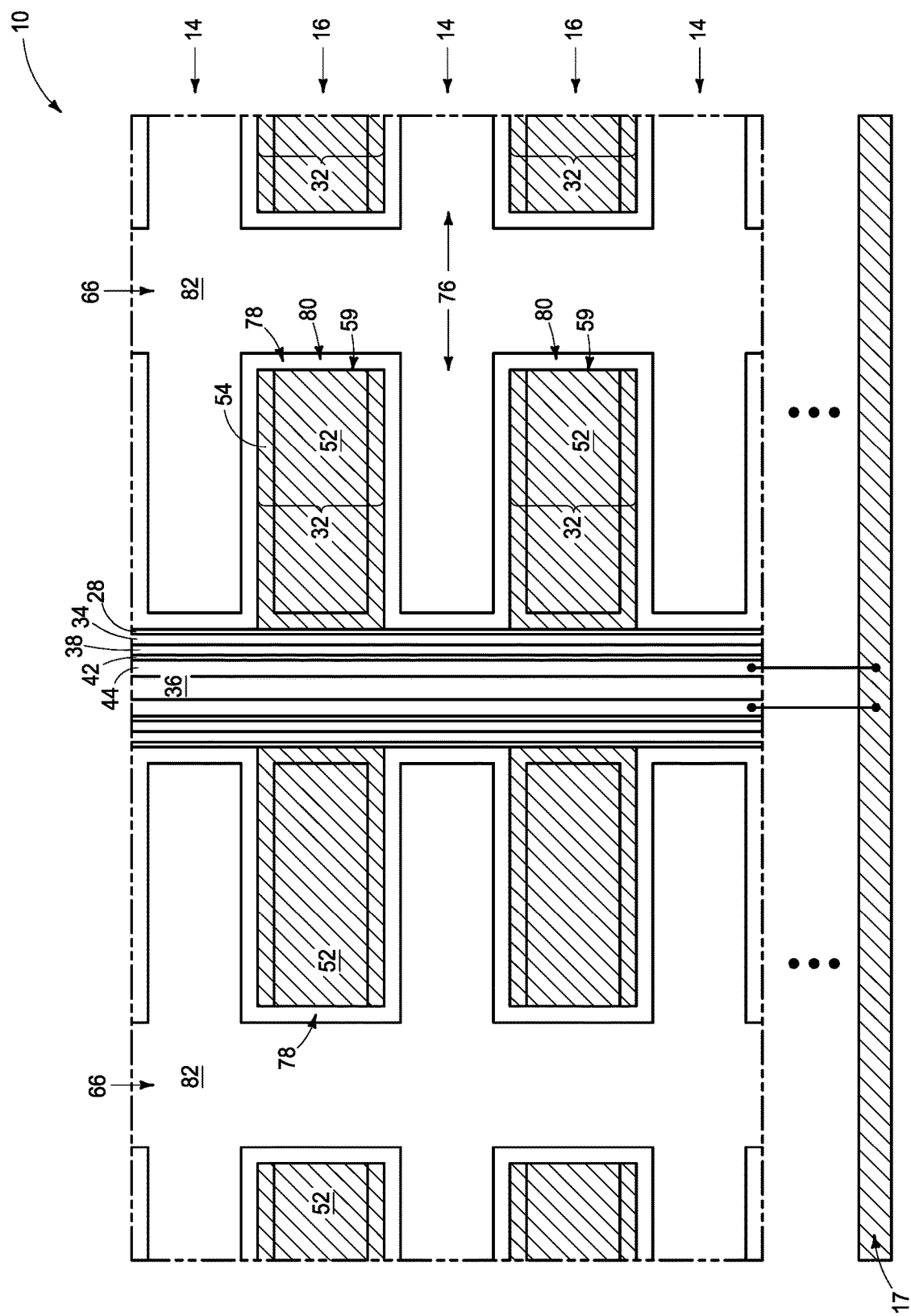

Referring to FIG. 15, insulative liners 78 are formed within the voids 76 to line the voids 76. The liners 76 include regions 80 which extend along the distal ends 59 of the conductive structures 32.

The insulative liners 78 may comprise any suitable composition(s); and in some embodiments may comprise, consist essentially of, or consist of one or more of silicon dioxide, silicon oxynitride and silicon nitride. In some embodiments, the liners 78 may be referred to as comprising, consist essentially of, or consisting of one or more of SiO, SiN and SiON, where the chemical formulas indicate primary compositions rather than specific stoichiometries.

The insulative liners 78 may be formed to any suitable thickness, and in some embodiments may be formed to a thickness within a range of from about 1 nm to about 10 nm, a thickness within a range of from about 2 nm to about 4 nm, etc.

Sacrificial material 82 is formed within the lined voids 76, and over the distal ends 59 of the conductive structures 32. The sacrificial material 82 may comprise any suitable composition(s); and in some embodiments may comprise, consist essentially of, or consist of silicon. The silicon may be in any suitable crystalline form (e.g., one or more of monocrystalline, polycrystalline, amorphous, etc.), and may or may not have dopant (e.g., phosphorus, arsenic, boron, etc.) therein.

Figure 16:
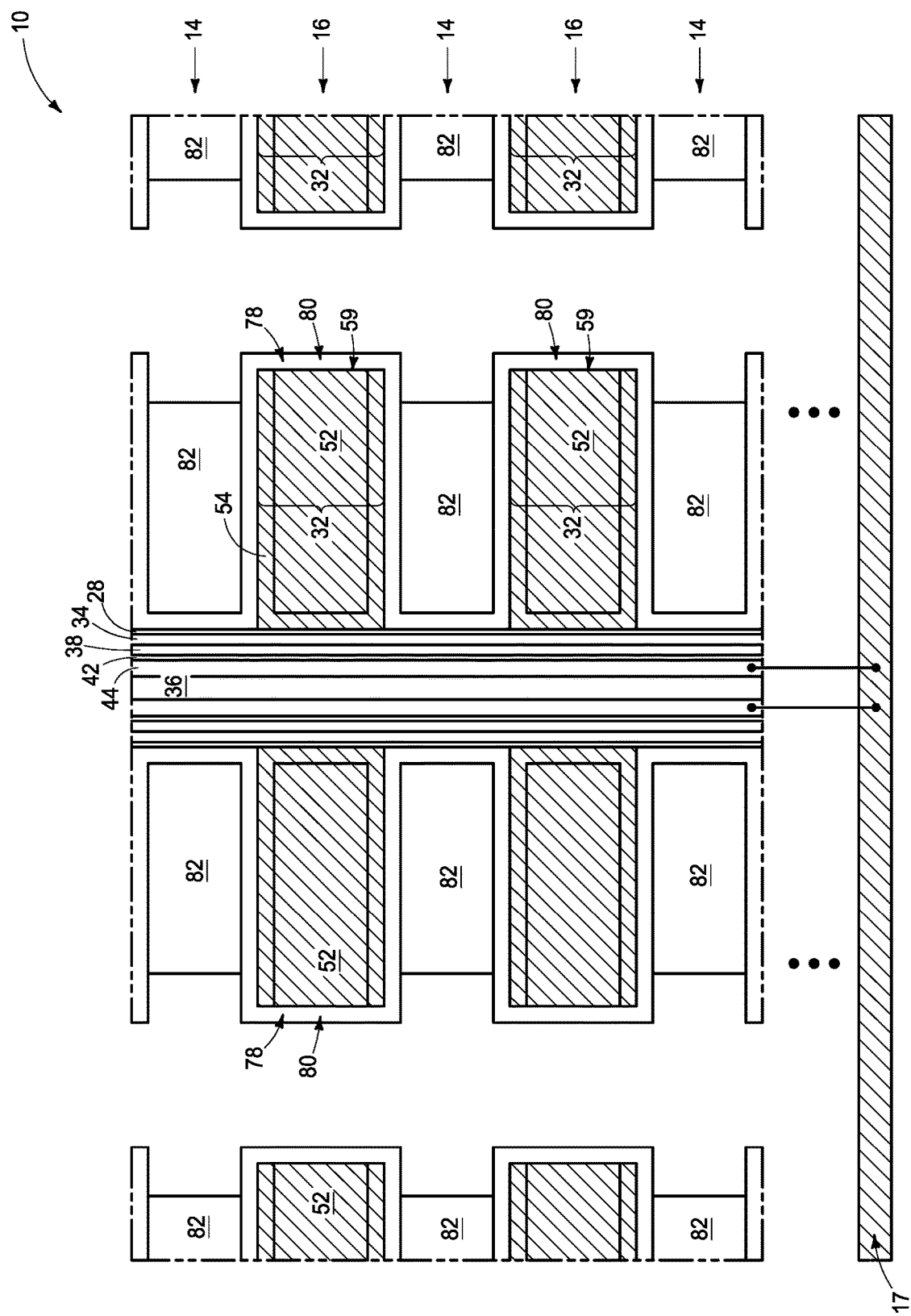

Referring to FIG. 16, the sacrificial material 82 is recessed to expose the regions 80 of the insulative liners 78 along the distal ends 59 of the conductive structures 32.

Figure 17:
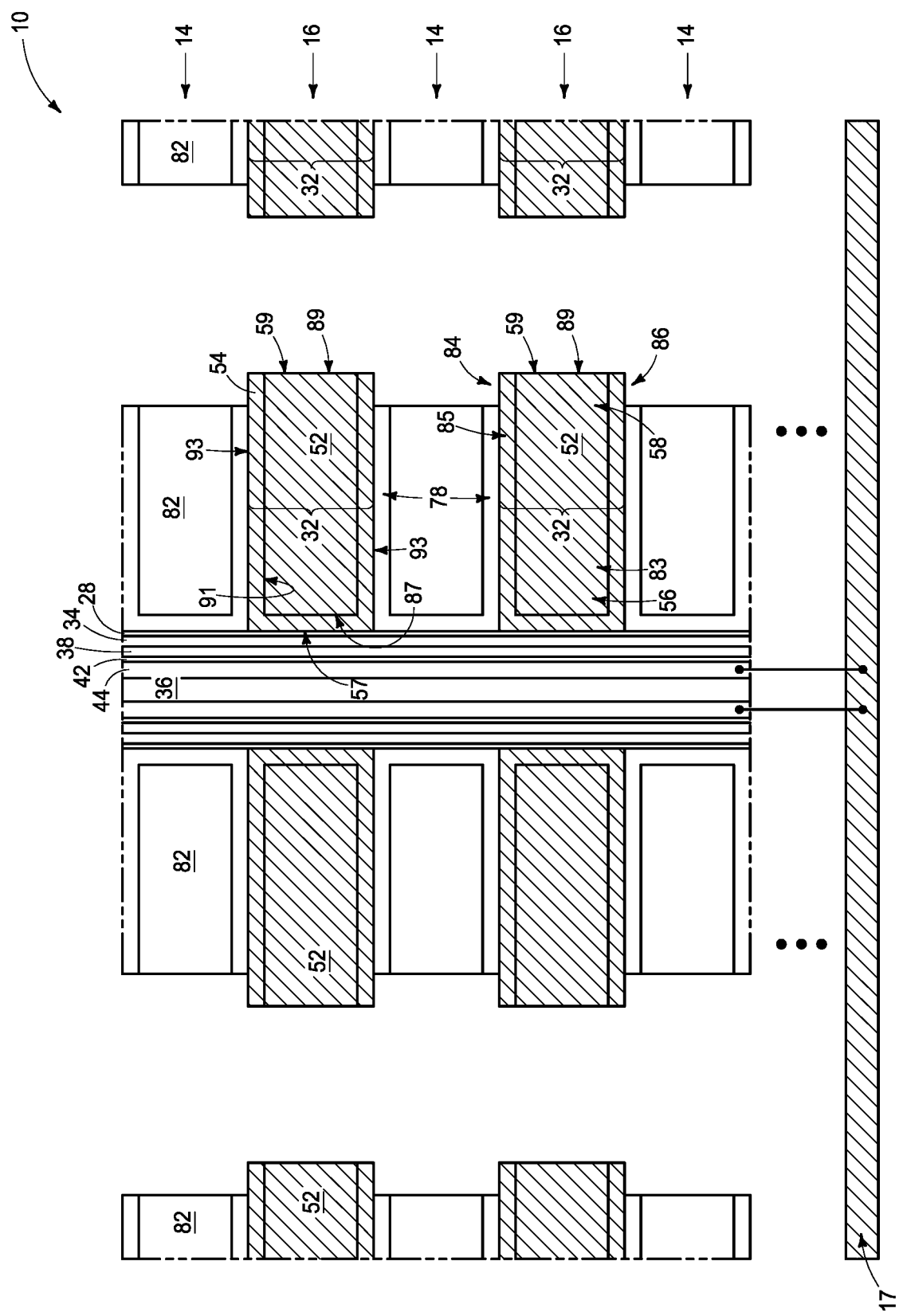

Referring to FIG. 17, the exposed regions 80 (FIG. 16) of the liners 78 are removed to expose the distal ends 59 of the conductive structures 32. In the shown embodiment, the exposed distal ends 59 include exposed regions of the metal-containing core material 52 and exposed regions of the metal-containing liner material 54. In some embodiments, the core material 52 may be considered to be configured as a core 83, and the liner material 54 may be considered be configured as a liner 85, and the distal ends 59 may be considered to include exposed regions of the cores 83 and the liners 85.

In some embodiments, each of the liners 85 may be considered to wrap around a proximal end 87 of an associated core 83, and to leave a distal end 89 of the associated core exposed. The cross-sectional view of FIG. 17 shows the illustrated liners 85 each having a first surface 91 directly against an associated one of the cores 83, and having a second surface 93 in opposing relation to the first surface 91. The distal regions 58 of the conductive structures 32 include a pair of exposed segments 84 and 86 of the liners 85. The segment 84 is above the associated one of the cores 83, and the segment 86 is below the associate one of the cores 83. The distal regions 58 of the conductive structures 32 also include the exposed distal end 89 of the associated one of the cores 83.

Figure 18:
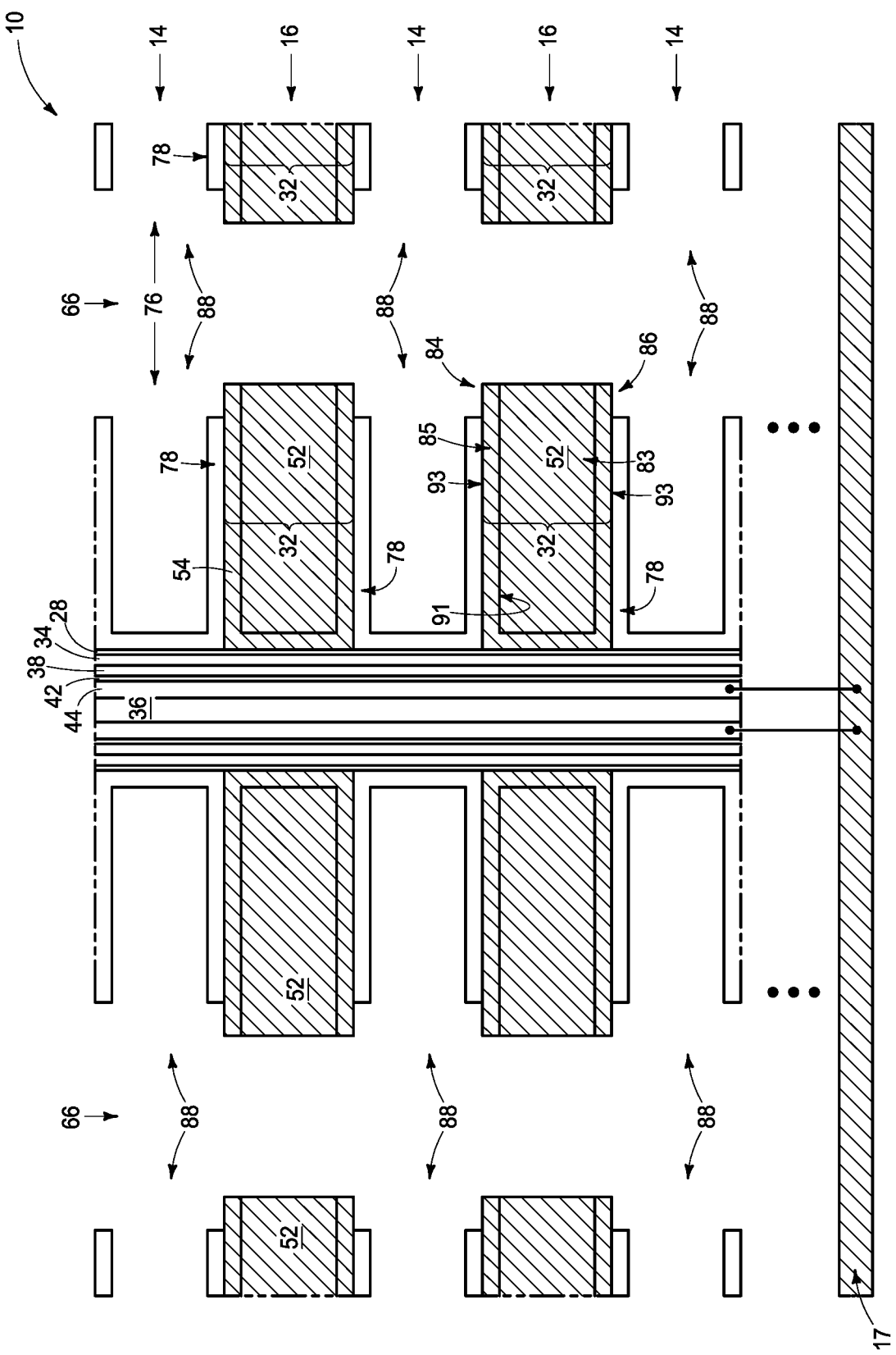

Referring to FIG. 18, remaining portions of the sacrificial material 82 (FIG. 17) are removed to open (reopen) the voids 76. The reopened voids 76 may be considered to have end regions 88 along the slits 66. In some embodiments, the sacrificial material 82 may comprise silicon, and may be removed utilizing tetramethylammonium hydroxide.

The insulative liners 78 are directly against regions of the second surfaces 93 of the conductive liners 85. In some embodiments, the conductive liners 85 may comprise metal nitride, and the insulative liners 78 may be referred to as being directly against the metal nitride-containing second surfaces 93 of such conductive liners.

Figure 19:
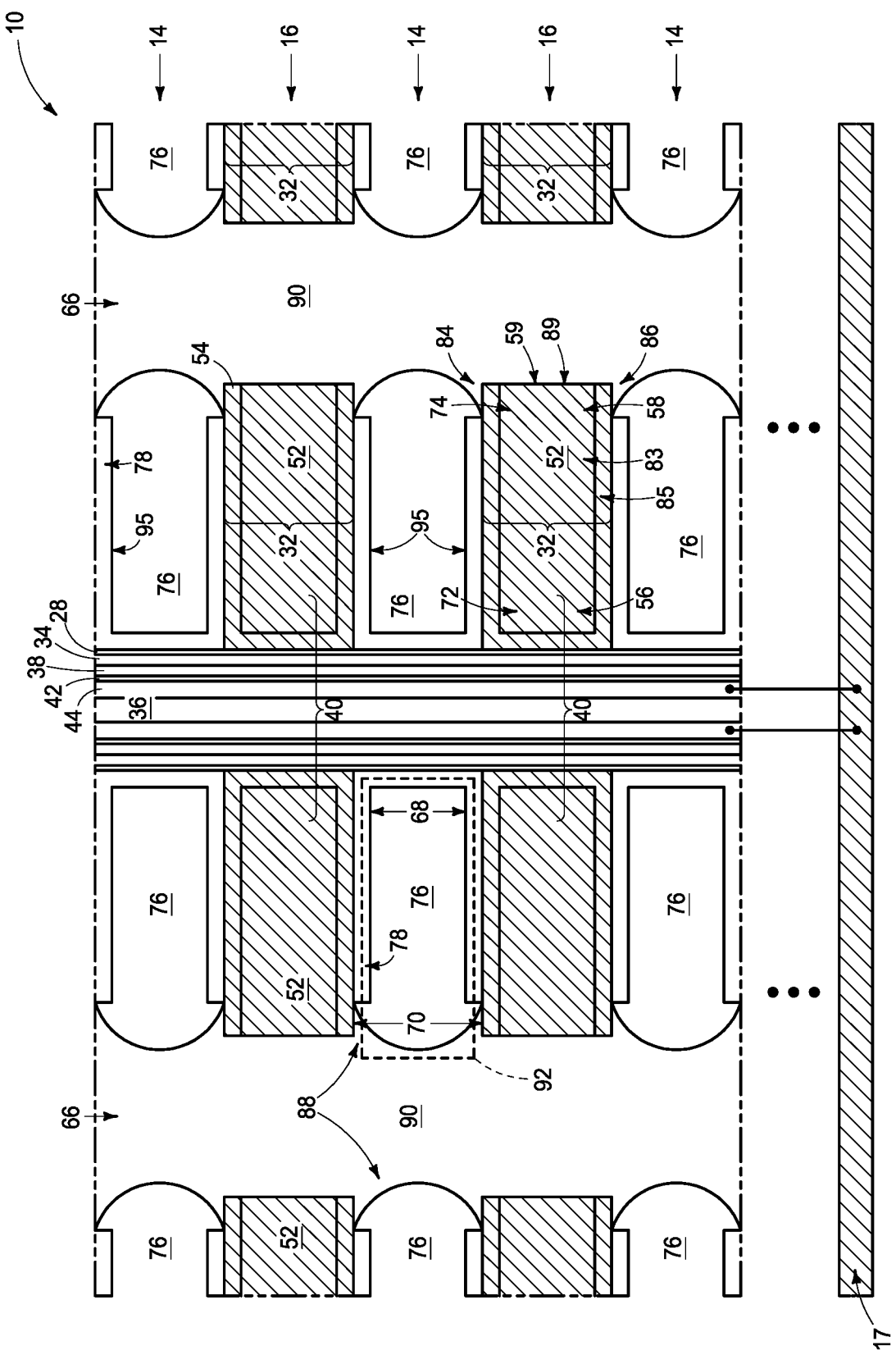

Referring to FIG. 19, insulative material 90 is formed within the slits 66. The insulative material 90 may be formed by any suitable deposition process (e.g., atomic layer deposition, chemical vapor deposition, etc.). The insulative material 90 may comprise any suitable composition(s); and in some embodiments may comprise one or more of SiO, SiON and SiN, where the chemical formulas indicate primary constituents rather than specific stoichiometries. Accordingly, in some embodiments the insulative material 90 may comprise, consist essentially of, or consist of more of silicon dioxide, silicon oxynitride and silicon nitride.

The insulative material 90 is selectively formed along the conductive materials 52 and 54 of the structures 32 relative to the insulative liners 78. For purposes of understanding this disclosure and the claims that follow, a first material is considered to be selectively formed on a second material relative to a third material if the first material is formed faster on the second material than on the third material; which can include, but which is not limited to, processes which are 100% selective for formation of the first material on the second material relative to the third material.

The insulative liners 78 may be considered to have outer surfaces 95 facing the voids 76. In the illustrated embodiment, the insulative material 90 is substantially not along the outer surfaces 95 of the insulative of liners 78. In some embodiments there may be none of the insulative material 90 against the outer surfaces 95 of the insulative liners 78. In other embodiments there may be some of the insulative material 90 along the outer surfaces 95 of the insulative liners 78 without completely closing the voids 76 between the conductive structures 32.

In some embodiments, the insulative liners 78 comprise silicon dioxide, and a hindering material (also referred to herein as a poisoning material) is formed along the silicon dioxide of the insulative liners 78 to preclude subsequent formation of the insulative material 90 on the surfaces of the insulative liners 78. The hindering material (poisoning material) may be formed by treating the insulative liners 78 with any suitable substance(s); and in some embodiments the treatment may comprise exposing the insulative liners to one or more of N,N dimethylaminotrimethylsilane, bis(N,N-dimethylamino)dimethylsilane, ethylenediamine, 1-trimethylsilylpyrrolidine, 1-trimethylsilylpyrrole, 3,5-dimethyl-1-trimethylsilyl, and R1-(C—OH)—R2; where R1 and R2 are organic moieties.

The insulative material 90 extends across the end regions 88 of the voids 76, and may be considered to cap the end regions 88 of the voids. Remaining portions of the voids 76 remain within the insulative levels 14.

The levels 16 of FIG. 19 may be considered to be conductive levels (memory cell levels), with such conductive levels comprising the conductive structures 32. The conductive levels 16 alternate with the insulative levels 14 in the vertical stack 12 at the process stage of FIG. 19.

The conductive structures 32 have the proximal regions 56 near the channel material 44, and have the distal regions 58 further from the channel material 44 than the proximal regions 56.

The insulative levels 14 may be considered to have first regions 68 vertically between the proximal regions 56 of vertically-neighboring conductive structures 32, and to have second regions 70 between the distal regions 58 of the vertically-neighboring conductive structures. The voids 76 extend across the first and second regions 68 and 70. In some embodiments, the insulative liners 78 may be considered to be along the proximal regions 56 of the conductive structures 32 and not along the distal regions 58; and thus may be considered to be along the first regions 68 of the insulative levels 14 and not along the second regions 70.

In some embodiments, each of the voids 76 of FIG. 19 may be considered to be within a four-sided area 92 along the cross-section of FIG. 19. The insulative liners 78 are along three of the four sides of the four-sided areas, and the insulative material 90 is along the fourth sides of the four-sided areas.

The configuration of FIG. 19 includes the NAND memory cells 40 described above with reference to FIG. 13. Each of the NAND memory cells 40 includes a control gate region 72 within a conductive level 16 (i.e., associated with a conductive structure 32). The control gate regions 72 comprise control gates analogous to those described above with reference to FIGS. 1-4. The conductive structures 32 comprise the routing (wordline) regions 74 adjacent to (proximate to) the control gate regions 72.

Figure 20:
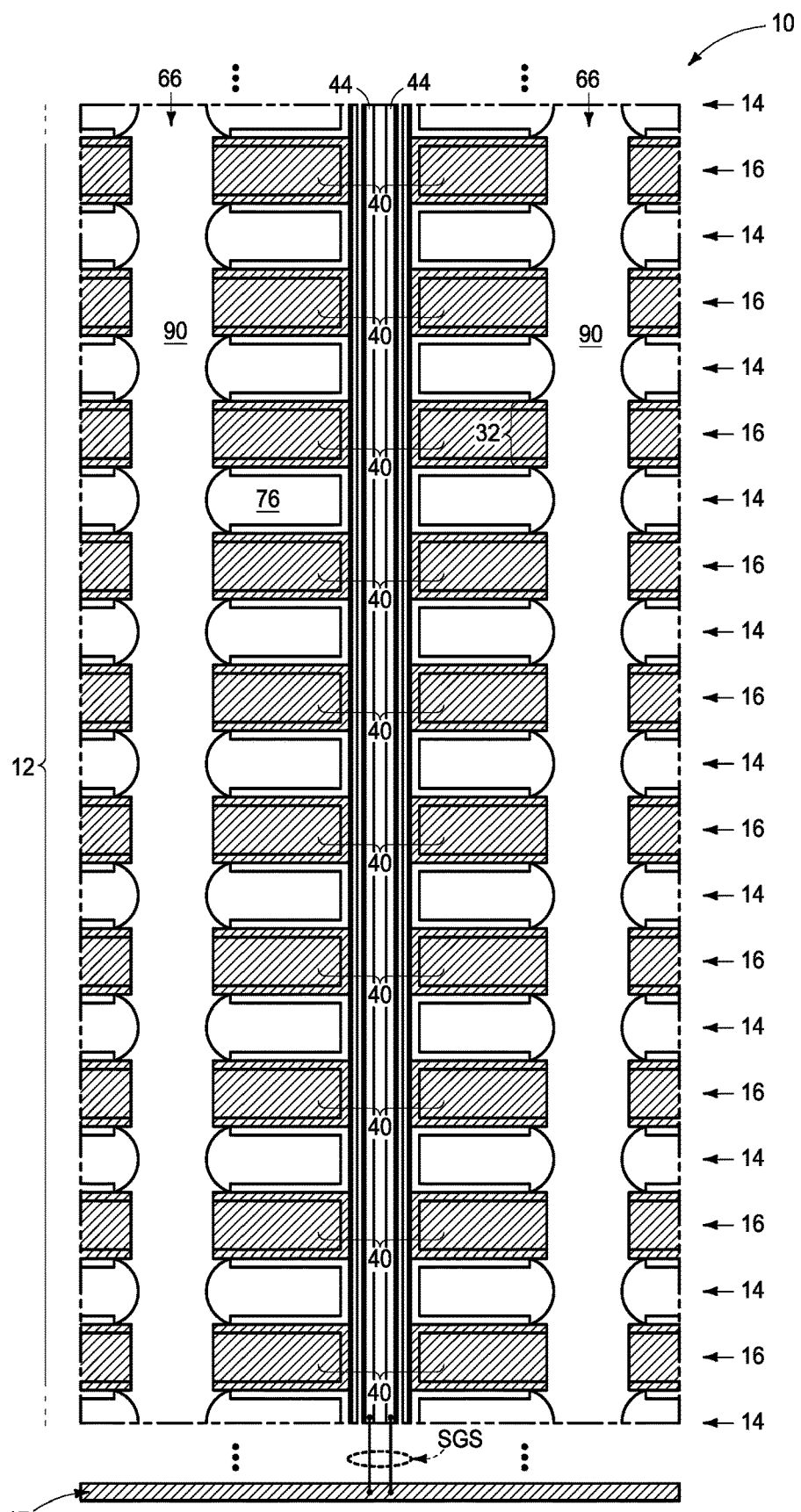
FIG. 20 is a diagrammatic cross-sectional side view of a region of an example integrated assembly. The assembly of FIG. 20 may be identical to that of FIG. 19, and the region of FIG. 20 may correspond to a larger region of the assembly than is shown in FIG. 19.

The processing described herein may advantageously form the insulative material 90 within the slits 66 of a tall stack 12 of alternating insulative and conductive levels (14 and 16) without pinching the voids 76 between the conductive structures 32 within the conductive levels 16. For instance, FIG. 20 shows a region of a tall stack 12, and shows that the insulative material 90 may fill the stack from the bottom to the top without pinching the voids 76. The tall stack may any suitable number of conductive levels 16; and in some embodiments may comprise 16 of the conductive levels 16, 32 of the conductive levels 16, 64 of the conductive levels 16, 128 of the conductive levels 16, etc.

A source-side select gate (SGS) device is diagrammatically illustrated to be along the conductive contact which extends from the channel material 44 to the source structure 17. The SGS device may have any suitable configuration.

The configurations of FIGS. 19 and 20 may be final structures of a memory arrangements (e.g., assemblies configured to include NAND memory).

In operation, the charge-storage material 38 (FIG. 19) may be configured to store information in the memory cells 40 of the various embodiments described herein. The value (with the term "value" representing one bit or multiple bits) of information stored in an individual memory cell may be based on the amount of charge (e.g., the number of electrons) stored in a charge-storage region of the memory cell. The amount of charge within an individual charge-storage region may be controlled (e.g., increased or decreased), at least in part, based on the value of voltage applied to an associated gate 72 (FIG. 19), and/or based on the value of voltage applied to the channel material 44.

The tunneling material 42 (FIG. 19) forms tunneling regions of the memory cells 40. Such tunneling regions may be configured to allow desired migration (e.g., transportation) of charge (e.g., electrons) between the charge-storage material 38 (FIG. 19) and the channel material 44. The tunneling regions may be configured (i.e., engineered) to achieve a selected criterion, such as, for example, but not limited to, an equivalent oxide thickness (EOT). The EOT quantifies the electrical properties of the tunneling regions (e.g., capacitance) in terms of a representative physical thickness. For example, EOT may be defined as the thickness of a theoretical silicon dioxide layer that would be required to have the same capacitance density as a given dielectric, ignoring leakage current and reliability considerations.

The charge-blocking material 34 (FIG. 19) may provide a mechanism to block charge from flowing from the charge-storage material 38 to the associated gates 72.

The dielectric-barrier material (high-k material) 28 (FIG. 19) may be utilized to inhibit back-tunneling of charge carriers from the gates 72 toward the charge-storage material 38. In some embodiments, the dielectric-barrier material 28 may be considered to form dielectric-barrier regions within the memory cells 40.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a vertical stack of alternating insulative levels and conductive levels. The conductive levels include conductive structures. Channel material extends vertically through the stack. The conductive structures have proximal regions near the channel material, and have distal regions further from the channel material than the proximal regions. The insulative levels have first regions vertically between the proximal regions of neighboring conductive structures, and have second regions vertically between the distal regions of the neighboring conductive structures. Voids are within the insulative levels and extend across portions of the first and second regions. The insulative levels include insulative liners along the proximal regions of the conductive structures and not along the distal regions of the conductive structures. The insulative liners have outer surfaces on opposing sides of the insulative liners from the conductive structures. The outer surfaces face the voids. Insulative material extends through the stack and is directly along the distal regions of the conductive structures. The insulative material caps ends of the voids and is substantially not along the outer surfaces of the insulative liners.

Some embodiments include a method of forming an integrated assembly. A stack is formed to have alternating first and second levels along a vertical direction. The first levels comprise first material and the second levels comprise second material. An opening is formed to extend through the stack. Charge-storage material, tunneling material and channel material are formed within the opening. Slits are formed to extend through the stack. Etchant is flowed into the slits to remove the second material and to leave first voids between the first levels. Conductive structures are formed within the first voids. The conductive structures have proximal ends adjacent the channel material, and have distal ends adjacent the slits. The first material is removed to leave second voids between the conductive structures. Insulative liners are formed within the second voids to line the second voids. Regions of the insulative liners are along the distal ends of the conductive structures. Sacrificial material is formed within the lined second voids and over the regions of the insulative liners along the distal ends of the conductive structures. The sacrificial material is recessed to expose the regions of the insulative liners along the distal ends of the conductive structures. The exposed regions of the insulative liners are removed to expose the distal ends of the conductive structures. The sacrificial material is removed to reopen the second voids. The reopened second voids have end regions along the slit. Insulative material is formed within the slits. The insulative material is formed selectively along the conductive material relative to the insulative liners, and extends across the end regions of the reopened second voids.

Some embodiments include a method of forming an integrated assembly. A vertical stack of alternating first and second levels is formed. The first levels comprise first material and the second levels comprise second material. An opening is formed to extend through the stack. A first liner is formed within the opening to line the opening. The first liner has first regions along the first levels and second regions along the second levels. Dielectric-barrier material, charge-blocking material, charge-storage material, tunneling material and channel material are formed within the lined opening. The second material is removed to leave first voids between the first levels, and to expose the second regions of the first liner. The second regions of the first liner are removed, and then conductive structures are formed within the first voids. The conductive structures have proximal ends adjacent the channel material, and have distal ends in opposing relation to the proximal ends. The first material is removed to leave second voids between the conductive structures. The second voids are lined with insulative liners. The insulative liners have regions extending around the distal ends of the conductive structures. Sacrificial material is formed within the lined second voids and over the distal ends of the conductive structures. The sacrificial material is recessed to expose the regions of the insulative liners along the distal ends of the conductive structures. The exposed regions of the insulative liners are removed to expose the distal ends of the conductive structures. The sacrificial material is removed to open the second voids, and then insulative material is formed along the exposed distal ends of the conductive structures and across ends of the second voids. The insulative material caps the ends of the second voids.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an integrated assembly, comprising:
    forming a vertical stack of alternating first and second levels; the first levels comprising first material and the second levels comprising second material;
    forming an opening to extend through the stack;
    forming charge-storage material, tunneling material and channel material within the opening;
    forming slits to extend through the stack;
    flowing etchant into the slits to remove the second material and leave first voids between the first levels;
    forming conductive structures within the first voids; the conductive structures having proximal ends adjacent the channel material, and having distal ends adjacent the slits;
    removing the first material to leave second voids between the conductive structures;
    forming insulative liners within the second voids to line the second voids, regions of the insulative liners being along the distal ends of the conductive structures;
    forming sacrificial material within the lined second voids and over the regions of the insulative liners along the distal ends of the conductive structures;
    recessing the sacrificial material to expose the regions of the insulative liners along the distal ends of the conductive structures;
    removing the exposed regions of the insulative liners to expose the distal ends of the conductive structures;
    removing the sacrificial material to reopen the second voids; the reopened second voids having end regions along the slit; and
    forming insulative material within the slits; the insulative material being formed selectively along the conductive material relative to the insulative liners, and extending across the end regions of the reopened second voids.

2. The method of claim 1 further comprising forming dielectric-barrier material and charge-blocking material within the opening.

3. The method of claim 1 wherein the first material comprises silicon dioxide and the second material comprises silicon nitride.

4. The method of claim 1 wherein the sacrificial material comprises silicon.

5. The method of claim 4 wherein the removing of the sacrificial material utilizes tetramethylammonium hydroxide.

6. The method of claim 1 wherein the insulative liners comprise silicon dioxide.

7. The method of claim 1 wherein the insulative liners comprise silicon dioxide; wherein the insulative material comprises one or more of silicon dioxide, silicon oxynitride and silicon nitride; and further comprising treating the insulative liners prior to forming the insulative material, said treating comprising exposing the insulative liners to one or more of N,N dimethylaminotrimethylsilane, bis(N,N-dimethylamino)dimethylsilane, ethylenediamine, 1-trimethylsilylpyrrolidine, 1-trimethylsilylpyrrole, 3,5-dimethyl-1-trimethylsilyl, and R1-(C—OH)—R2; where R1 and R2 are organic moieties.

8. The method of claim 1 wherein the each of the conductive structures comprises a metal-containing core and a metal-nitride-containing liner along an outer periphery of the metal-containing core; and wherein the exposed distal ends of the conductive structures include exposed regions of the metal-containing cores and exposed regions of the metal-nitride-containing liners.

9. A method of forming an integrated assembly, comprising:
    forming a vertical stack of alternating first and second levels; the first levels comprising first material and the second levels comprising second material;
    forming an opening to extend through the stack;
    forming a first liner within the opening to line the opening; the first liner having first regions along the first levels and second regions along the second levels;
    forming dielectric-barrier material, charge-blocking material, charge-storage material, tunneling material and channel material within the lined opening;
    removing the second material to leave first voids between the first levels, and to expose the second regions of the first liner;
    removing the second regions of the first liner;
    after removing the second regions of the first liner, forming conductive structures within the first voids; the conductive structures having proximal ends adjacent the channel material, and having distal ends in opposing relation to the proximal ends;
    removing the first material to leave second voids between the conductive structures;
    lining the second voids with insulative liners, the insulative liners having regions extending around the distal ends of the conductive structures;
    forming sacrificial material within the lined second voids and over the distal ends of the conductive structures;
    recessing the sacrificial material to expose the regions of the insulative liners along the distal ends of the conductive structures;
    removing the exposed regions of the insulative liners to expose the distal ends of the conductive structures;
    removing the sacrificial material to open the second voids; and after removing the sacrificial material, forming insulative material along the exposed distal ends of the conductive structures and across ends of the second voids to cap the ends of the second voids.

10. The method of claim 9 further comprising removing the first regions of the first liner prior to forming the insulative liners within the second voids.

11. The method of claim 9 wherein the insulative material is formed selectively along the conductive structures relative to the insulative liners.

12. The method of claim 9 wherein the insulative liners comprise one or more of SiO, SiN and SiNO, where the chemical formulas indicate primary constituents rather than specific stoichiometries.

13. The method of claim 9 wherein the insulative liners comprise silicon dioxide.

14. The method of claim 13 wherein the insulative liners comprise silicon dioxide; wherein the insulative material comprises one or more of silicon dioxide, silicon oxynitride and silicon nitride; and further comprising treating the insulative liners prior to forming the insulative material, said treating comprising exposing the insulative liners to one or more of N,N dimethylaminotrimethylsilane, bis(N,N-dimethylamino)dimethylsilane, ethylenediamine, 1-trimethylsilylpyrrolidine, 1-trimethylsilylpyrrole, 3,5-dimethyl-1-trimethylsilyl, and R1-(C—OH)—R2; where R1 and R2 are organic moieties.

15. The method of claim 14 wherein the insulative material comprises silicon dioxide.

16. The method of claim 9 wherein the first liner is a carbon-containing material.

* * * * *